(12) United States Patent
Levermore et al.

(10) Patent No.: US 8,981,640 B2
(45) Date of Patent: Mar. 17, 2015

(54) SIMPLIFIED PATTERNED LIGHT PANEL

(75) Inventors: Peter Levermore, Belo Horizonte (BR);
Huiqing Pang, Newtown, PA (US);
Prashant Mandlik, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 240 days.

(21) Appl. No.: 13/468,831

(22) Filed: May 10, 2012

(65) Prior Publication Data

US 2012/0286651 A1    Nov. 15, 2012

Related U.S. Application Data

(60) Provisional application No. 61/485,658, filed on May 13, 2011.

(51) Int. Cl.
*H05B 33/14*    (2006.01)
*H05B 33/26*    (2006.01)
*H05B 33/28*    (2006.01)
(Continued)

(52) U.S. Cl.
CPC ............ *H01L 51/5209* (2013.01); *H05B 33/10* (2013.01); *H01L 51/5212* (2013.01); *H01L 51/5215* (2013.01); *Y10S 428/917* (2013.01)
USPC ............ 313/504; 313/506; 428/690; 428/917

(58) Field of Classification Search
CPC ............ H01L 51/5209; H01L 51/5212; H01L 51/5215; H01L 51/5275; H01L 27/3237; H01L 27/3239
USPC ............................ 313/504–506; 428/690, 917
See application file for complete search history.

(56) References Cited

U.S. PATENT DOCUMENTS 4,769,292 A    9/1988  Tang et al.
5,247,190 A    9/1993  Friend et al.
(Continued)

FOREIGN PATENT DOCUMENTS

WO    WO 2010070563 A2 *  6/2010
WO    WO 2011/096922          8/2011

OTHER PUBLICATIONS

Baldo et al., "Highly Efficient Phosphorescent Emission from Organic Electroluminescent Devices," Nature, vol. 395, 151-154, (1998).
(Continued)

*Primary Examiner* — Sikha Roy
(74) *Attorney, Agent, or Firm* — Morris & Kamlay LLP

(57) ABSTRACT

A first device may be provided in some embodiments. The first device may comprise a substrate, a first emissive region, and a second emissive region, where the first emissive region and the second emissive region may comprise a contiguous area. The first device may further comprise a first electrode disposed over the substrate that extends across the first and the second emissive regions, and an organic layer disposed over the substrate that extends across the first and second emissive regions, where the organic layer comprises the same emissive material across the first and the second emissive regions. The first device may further include a second electrode disposed over the substrate that extends across the first and second emissive regions, where the second electrode includes a patterned layer of conductive material that is disposed in the first emissive region and that is not disposed in the second emissive region.

22 Claims, 25 Drawing Sheets

(51) Int. Cl.
*H01L 51/52* (2006.01)
*H05B 33/10* (2006.01)

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,133,581 | A * | 10/2000 | Terao et al. ............ 257/40 |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,538,374 | B2 * | 3/2003 | Hosokawa ............ 313/504 |
| 6,693,296 | B1 | 2/2004 | Tyan et al. |
| 7,268,485 | B2 | 9/2007 | Tyan et al. |
| 7,279,704 | B2 | 10/2007 | Walters et al. |
| 7,431,968 | B1 | 10/2008 | Shtein et al. |
| 7,901,538 | B2 * | 3/2011 | Yukinobu ............ 156/290 |
| 8,502,445 | B2 * | 8/2013 | Levermore et al. ...... 313/504 |
| 8,552,420 | B2 * | 10/2013 | Levermore et al. ........ 257/40 |
| 8,618,727 | B2 * | 12/2013 | Goldmann ............ 313/503 |
| 2003/0230980 | A1 | 12/2003 | Forrest et al. |
| 2004/0099305 | A1 | 5/2004 | Heller |
| 2004/0174116 | A1 | 9/2004 | Lu et al. |
| 2005/0040753 | A1 * | 2/2005 | Osame et al. ............ 313/500 |
| 2006/0097631 | A1 * | 5/2006 | Lee ............ 313/504 |
| 2007/0013293 | A1 * | 1/2007 | Cok ............ 313/504 |
| 2008/0100211 | A1 * | 5/2008 | Klein et al. ............ 313/504 |
| 2009/0184628 | A1 * | 7/2009 | Kang et al. ............ 313/504 |
| 2010/0127617 | A1 * | 5/2010 | Hayafuji et al. ............ 313/504 |
| 2012/0286298 | A1 | 11/2012 | Pang et al. |
| 2012/0286648 | A1 | 11/2012 | Pang et al. |
| 2013/0048961 | A1 | 2/2013 | Rajan et al. |

OTHER PUBLICATIONS

Baldo et al., "Very high-efficiency green organic light-emitting devices based on electrophosphorescence," Appl. Phys. Lett., vol. 75, No. 3, 4-6 (1999).

P.A. Levermore et al. J Soc. Inf. Disp. p. 18, vol. 26, No. 10, Oct. 2010.

Birnstock et al. (Novaled) OLED Lighting Design Summit (2009).

Tyan et al. (Kodak) OLED Lighting Design Summit (2009).

U.S. Appl. No. 61/485,658, filed May 13, 2011.

* cited by examiner

Blue Dopant A
 Blue Host A
 Host B
 Red Dopant A
 NPD
 Green Dopant A

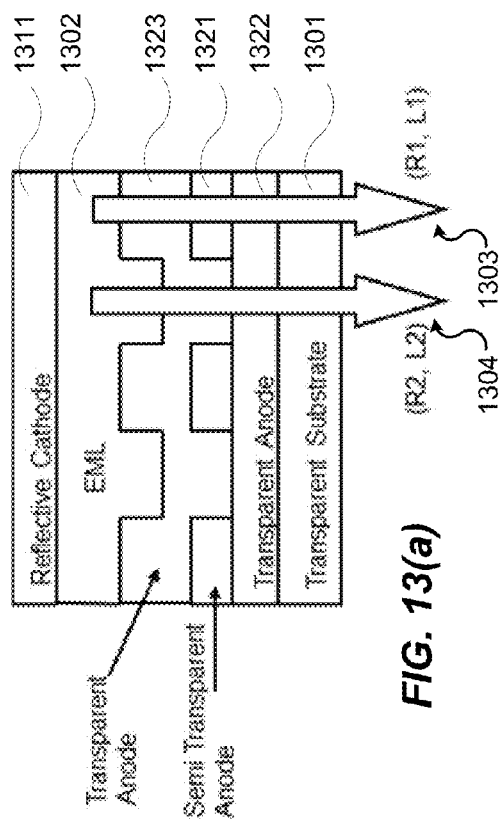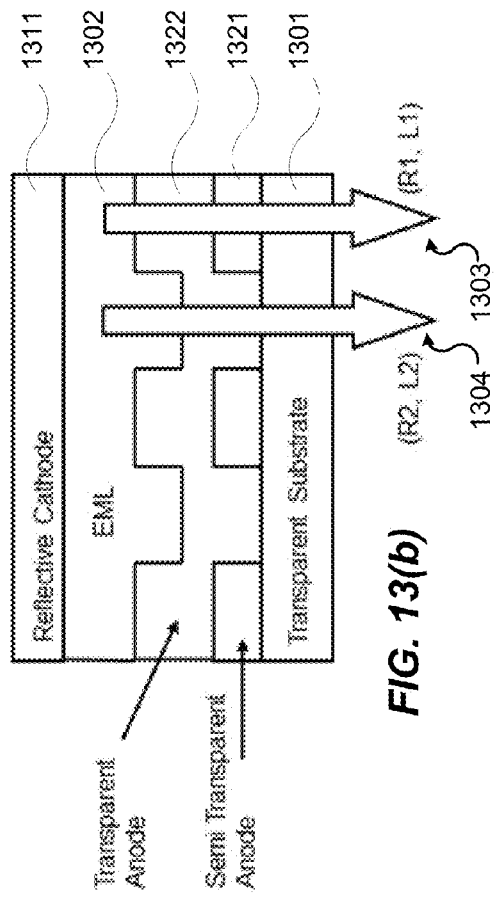
FIG. 13(a)
FIG. 13(b)

SIMPLIFIED PATTERNED LIGHT PANEL

CROSS-REFERENCES TO RELATED APPLICATIONS

This application claims benefit under 35 U.S.C. §119(e) of U.S. provisional patent application No. 61/485,658, filed on May 13, 2011, the entire disclosure of which is incorporated herein by reference for all purposes.

The present application also comprises subject matter that may be related to U.S. patent application Ser. No. 13/106,733, filed on May 12, 2011 entitled "Bus Line Designs For Large-Area OLED Lighting;" U.S. patent application Ser. No. 13/105,770, filed May 11, 2011, entitled "Process for Fabricating Metal Bus Lines for OLED Lighting Panels;" and International Patent Application No. PCT/US2010/23034 entitled "Organic Light Emitting Device With Enhanced Emission Uniformity," filed Feb. 3, 2010, each of which is incorporated herein by reference in their entireties.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the structure of Formula I:

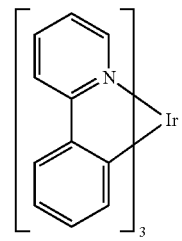

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Embodiments provided herein may comprise devices that may include an OLED light panel having brightness and/or color variation that is achieved by controlling the reflectance or transmittance of the electrodes (e.g. cavity effect) of such devices at different positions on the panel. This may be achieved in some embodiments by utilizing one or more electrodes that include a patterned layer of material that may be disposed in different portions of the device so as to provide a plurality of emissive regions, where the light that is emitted from the device through each of those regions may have different optical properties (such as different chromaticity, hue, brightness, chromaticity based on viewing angle, etc.). Moreover, in some embodiments the patterned layer may comprise a conductive material such that the inclusion of the patterned layer may reduce the sheet resistance of the electrode, thereby increasing the uniformity of light emissions across the device. In embodiments where the conductive material of the patterned layer comprises a transparent or semi-transparent material, the device may have an increased aperture ratio (e.g. up to 100% aperture ratio in some embodiments), while still providing increased uniformity and/or variable emissive regions.

A first device may be provided in some embodiments. The first device may comprise a substrate, a first emissive region, and a second emissive region, where the first emissive region and the second emissive region may comprise a contiguous area. The first device may further comprise a first electrode disposed over the substrate that extends across the first and the second emissive regions, and an organic layer disposed over the substrate that extends across the first and second emissive regions, where the organic layer comprises the same emissive material across the first and the second emissive regions. The first device may further include a second electrode disposed over the substrate that extends across the first and second emissive regions, where the second electrode includes a patterned layer of conductive material that is disposed in the first emissive region and that is not disposed in the second emissive region.

In some embodiments, in the first device as described above, the second electrode may be semi-transparent in the first emissive region, the second electrode may be transparent in the second emissive region, and the first electrode may be opaque or reflective. In some embodiments, the substrate may be transparent and the second electrode may be disposed over the substrate, the organic layer may be disposed over the second electrode, and the first electrode may be disposed over the organic layer. In some embodiments, the first electrode may be disposed over the substrate, the organic layer may be disposed over the first electrode, and the second electrode may be disposed over the organic layer.

In some embodiments, in the first device as described above, the second electrode may be semi-transparent or reflective in the first emissive region, the second electrode may be transparent in the second emissive region, and the first electrode may be transparent or semi-transparent. In some embodiments, the second electrode may be disposed over the substrate, the organic layer may be disposed over the second electrode, and the first electrode may be disposed over the organic layer. In some embodiments, the substrate may be transparent. In some embodiments, the substrate may be reflective.

In some embodiments, in the first device as described above, where the second electrode is semi-transparent or reflective in the first emissive region, the second electrode is transparent in the second emissive region, and the first electrode is transparent or semi-transparent, the first electrode may be disposed over the substrate, the organic layer may be disposed over the first electrode, and the second electrode may be disposed over the organic layer. In some embodiments, the substrate may be reflective.

In some embodiments, in the first device as described above, the second electrode may further comprise a blanket layer of conductive material that extends across the first and second emissive regions. In some embodiments, the patterned layer of conductive material of the second electrode may be disposed over the blanket layer of conductive material of the second electrode. In some embodiments, the blanket layer of conductive material of the second electrode may be disposed over the patterned layer of conductive material of the second electrode. In some embodiments, the blanket layer of conductive material and the patterned layer of conductive material of the second electrode may comprise different materials. In some embodiments, the blanket layer of conductive material of the second electrode may comprise a transparent conductive oxide (TCO) and, in some instances, the patterned layer of conductive material may comprise Ag. In some embodiments, the blanket layer of conductive material and the patterned layer of conductive material of the second electrode may comprise the same material.

In some embodiments, in the first device as described above where the second electrode further comprises a blanket layer of conductive material that extends across the first and second emissive regions, the first electrode may further comprise a blanket layer of conductive material and a patterned layer of conductive material. In some embodiments, the blanket layer of conductive material and the patterned layer of conductive material of the first electrode may comprise different materials. In some embodiments, the blanket layer of conductive material of the first electrode may be transparent and the patterned layer of conductive material of the first electrode may be reflective or semi-transparent. In some embodiments, the second electrode may be reflective in the first emissive region and the second electrode may be transparent or semi-transparent in the second emissive region. In some embodiments, the patterned layer of conductive material of the first electrode may be disposed in the first emissive region and may not be disposed in the second emissive region. In some embodiments, the patterned layer of conductive material of the first electrode may be disposed in the second emissive region and may not be disposed in the first emissive region. In some embodiments, the substrate may be transparent or semi-transparent, the first electrode may be disposed over the substrate, the organic layer may be disposed over the first electrode, and the second electrode may be disposed over the organic layer.

In some embodiments, in the first device as described above, the organic layer may have the same composition in the first and the second emissive regions.

In some embodiments, in the first device as described above, the organic layer may have a different composition in the first and the second emissive regions. In some embodiments, the thickness of the organic layer may be different in the first and the second emissive regions. In some embodiments, the thickness of the organic layer may vary by at least 10% between the first emissive region and the second emissive region. In some embodiments, the thickness of the organic layer may vary by at least 30% between the first emissive region and the second emissive region. In some embodiments, the thickness of the organic layer may vary by at least 50% between the first emissive region and the second emissive region.

In some embodiments, in the first device as described above, at least a portion of light that is emitted by the organic layer is emitted by the first emissive region and the second emissive region.

In some embodiments, in the first device as described above, the patterned layer of conductive material may have a thickness of less than 1000 Å. In some embodiments, the patterned layer of conductive material may have a thickness of less than 500 Å. In some embodiments, the patterned layer of conductive material may have a thickness of less than 250 Å.

In some embodiments, in the first device as described above, the patterned layer of conductive material may have a sheet resistance that is less than 10 ohm/sq. In some embodiments, the patterned layer of conductive material may have a sheet resistance that is less than 1.0 ohm/sq. In some embodiments, the patterned layer of conductive material has a transparency of at least 20%.

In some embodiments, in the first device as described above, the first device may have an aperture ratio of at least 90%. In some embodiments, the first device may have a 100% aperture ratio.

In some embodiments, in the first device as described above, the patterned layer may comprise a plurality of physically segmented portions.

In some embodiments, in the first device as described above, the first device may comprise a total emissive area that is equal to the first emissive region and the second emissive region, where the patterned layer of conductive material may be disposed over at least 10% of the total emissive area of the first device.

In some embodiments, in the first device as described above, the patterned layer of conductive material may comprise a contiguous layer of material.

In some embodiments, in the first device as described above, the organic layer may emit substantially white light.

In some embodiments, in the first device as described above, the light that is emitted by the first emissive region at normal incidence may have a first point on the CIE 1976 (L*, u*, v*) color space chromaticity diagram, the light that is emitted by the second emissive region at normal incidence may have a second point on the CIE 1976 (L*, u*, v*) color space chromaticity diagram, and the difference between the first point and the second point may have a duv value that is at least 0.01. In some embodiments, the difference between the first point and the second point may have a duv value that is greater than 0.05. In some embodiments, the difference between the first point and the second point may have a duv value that is greater than 0.10.

In some embodiments, in the first device as described above, the light that is emitted by the first emissive region may have a first luminance intensity and the light that is emitted by the second emissive region may have a second luminance intensity, where the first luminance intensity may be at least 20% different from the second luminance intensity.

In some embodiments, in the first device as described above, light that is emitted by the first emissive region at normal incidence may have a first point on the CIE 1976 (L*, u*, v*) color space chromaticity diagram and light that is emitted by the first emissive region at a viewing angle of 30° may have a second point on the CIE 1976 (L*, u*, v*) color space chromaticity diagram, where the difference between the first point and the second point may have a duv value that is at least 0.02. In some embodiments, the difference between the first point and the second point may have a duv value that is greater than 0.05. In some embodiments, the difference between the first point and the second point may have a duv value that is greater than 0.10.

In some embodiments, in the first device as described above, light that is emitted by the second emissive region at normal incidence may have a first point on the CIE 1976 (L*, u*, v*) color space chromaticity diagram and light that is emitted by the second emissive region at a viewing angle of 30° may have a second point on the CIE 1976 (L*, u*, v*) color space chromaticity diagram, where the difference between the first point and the second point may have a duv value that is less than 0.05.

In some embodiments, in the first device as described above, the first electrode may comprise a blanket layer.

In some embodiments, in the first device as described above, the organic layer may comprise a blanket layer.

In some embodiments, in the first device as described above, the first electrode may comprise a blanket layer, the second electrode may further comprise a blanket layer of conductive material that extends across the first and second emissive regions, and the organic layer may comprise a blanket layer.

In some embodiments, in the first device as described above, the first device may comprise a total emissive area that includes the first emissive region and the second emissive region. In some embodiments, the total emissive area may be greater than 50 cm$^2$ and the first device may have luminance uniformity across the second emissive region of at least 50%.

In some embodiments, in the first device as described above, the second electrode may further comprise a first conductive layer that extends across the first and second emissive regions and a second conductive layer that extends across the first and second emissive regions. In some embodiments, the patterned layer of the second electrode may be disposed between the first and second conductive layers. In some embodiments, the first and second conductive layers of the second electrode may be transparent. In some embodiments, the first and second conductive layers of the second electrode may comprise a TCO. In some embodiments, the patterned layer of the second electrode may be semi-transparent. In some embodiments, the patterned layer of the second electrode may comprise Ag.

In some embodiments, in the first device as described above where the second electrode may further comprise a first conductive layer that extends across the first and second emissive regions and a second conductive layer that extends across the first and second emissive regions, where the patterned layer of the second electrode is disposed between the first and second conductive layers, the first conductive layer of the second electrode may be reflective and the second conductive layer of the second electrode may be transparent. In some embodiments, the patterned layer of the second electrode may be reflective.

In some embodiments, in the first device as described above, the transmittance of the second electrode in the second emissive region may be at least 10% greater than the transmittance of the second electrode in the first emissive region. In some embodiments, the transmittance of the second electrode in the second emissive region may be at least 20% greater than the transmittance of the second electrode in the first emissive region. In some embodiments, the transmittance of the second electrode in the second emissive region may be at least 50% greater than the transmittance of the second electrode in the first emissive region.

In some embodiments, in the first device as described above, the second electrode may comprise a first conductive layer that has a sheet resistance that may be at least 20% greater than the sheet resistance of the patterned layer of conductive material. In some embodiments, the first conductive layer may have a sheet resistance that may be at least 50% greater than the sheet resistance of the patterned layer of conductive material. In some embodiments, the first conductive layer may have a sheet resistance that may be at least 100% greater than the sheet resistance of the patterned layer of conductive material.

In some embodiments, in the first device as described above, the substrate may be flexible.

A first device may also be provided in some embodiments that comprises a substrate and a first emissive region and a second emissive region, where the first emissive region and the second emissive region comprise a contiguous area. The first device may further comprise a first electrode that may be disposed over the substrate that extends across the first and the second emissive regions and an organic layer that may be disposed over the substrate that extends across the first and second emissive regions, where the organic layer may comprise the same emissive material across the first and the second emissive regions. The first device may further comprise a second electrode disposed over the substrate that extends across the first and second emissive regions, where the second electrode includes a patterned layer of conductive material having a first thickness disposed in the first emissive region and a second thickness disposed in the second emissive region, where the first and second thicknesses are different.

In some embodiments, in the first device as described above, the first thickness of the patterned layer may be 75% greater than the second thickness of the patterned layer. In some embodiments, the first thickness of the patterned layer may be 50% greater than the second thickness of the patterned layer. In some embodiments, the first thickness of the patterned layer may be 25% greater than the second thickness of the patterned layer. In some embodiments, the first thickness of the patterned layer may be 10% greater than the second thickness of the patterned layer.

In some embodiments, in the first device as described above, the substrate may be flexible.

BRIEF DESCRIPTION OF THE DRAWINGS

FIG. 3(a) shows the electrode of a bottom-emission device in accordance with some embodiments in which the electrode comprises a patterned layer of semi-transparent conductive material. FIG. 3(b) shows the electrode of a bottom-emission device comprising a blanket conductive layer and plurality of opaque bus lines disposed over the electrode. FIG. 3(c) shows the electrode of a bottom-emission device comprising a blanket conductive layer.

FIGS. 13(a)-(d) each discloses an exemplary embodiment of a bottom-emission device in accordance with some embodiments. FIG. 13(a) corresponds to the design shown in FIGS. 3(a) and 7. FIG. 13(b) shows an exemplary device comprising a patterned semi-transparent anode material that is deposited directly onto a transparent substrate. FIG. 13(c) shows an exemplary device comprising a semi-transparent anode material that is patterned to have different thicknesses across the exemplary panel. FIG. 13(d) shows an exemplary device comprising an organic stack that is deposited directly onto patterned semi-transparent anode material so as to enable charge injection directly from the semi-transparent anode material into the organic stack.

FIG. 19(a) shows the device illuminated.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
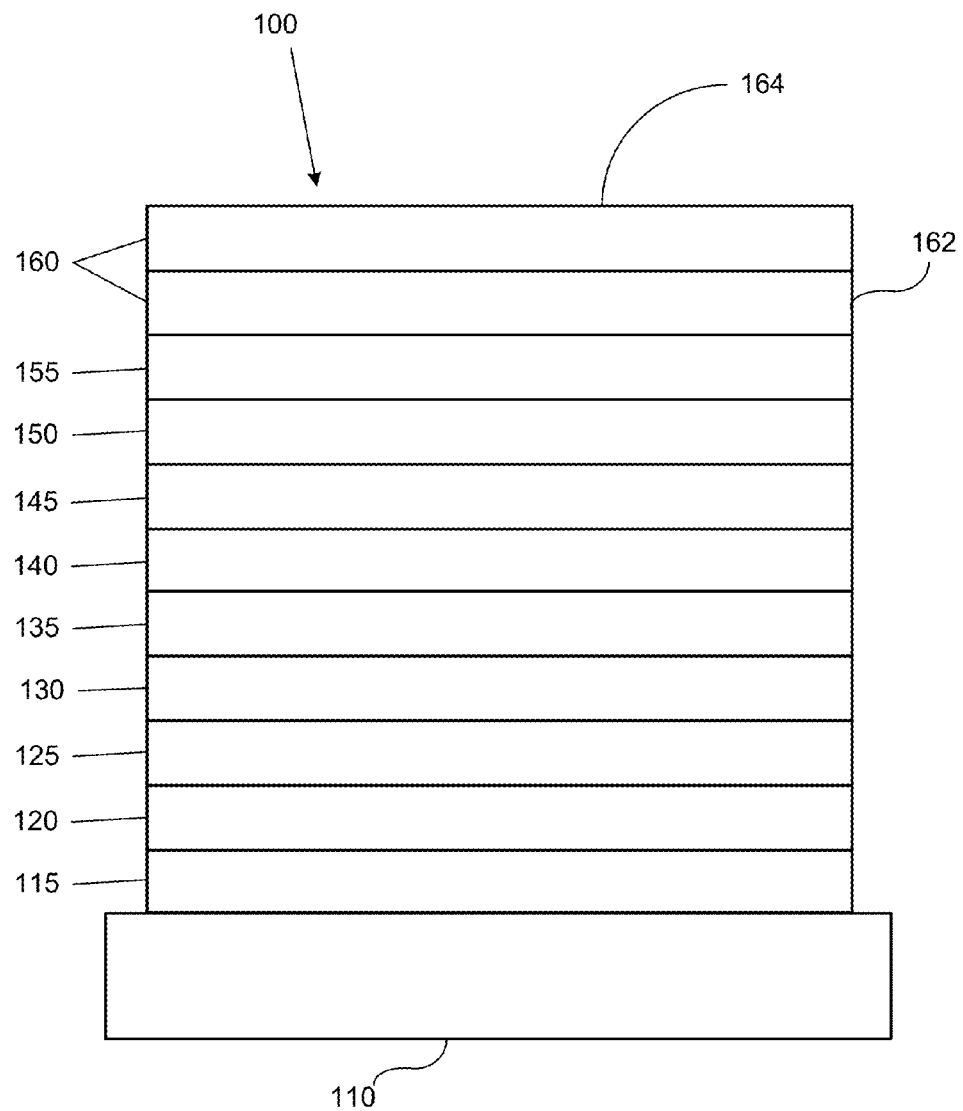
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F.sub.4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
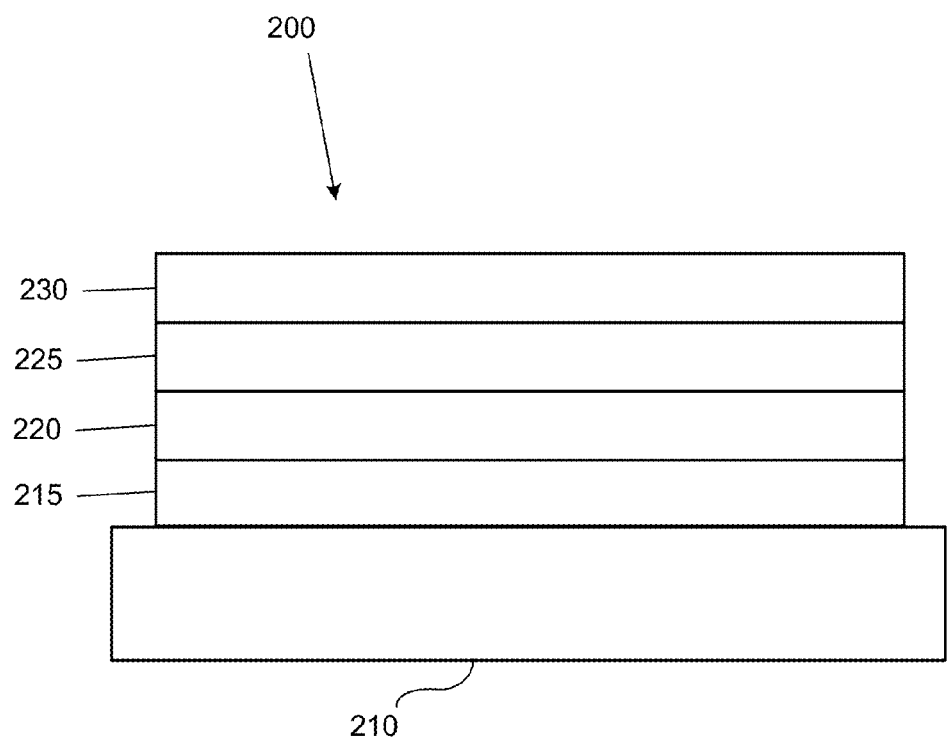
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors.

Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Some additional terms that may be used herein may be defined or described as follows:

As used herein, the "active area" or "emissive area" of an organic device may refer to the area where recombination occurs and/or photons are generated, which may correspond to the area of overlap of the first electrode and the second electrode. The "area" of overlap of the first and second electrode may refer to the surface area that is substantially perpendicular to the propagation direction of the majority of the light that passes though the electrode.

As used herein, the term "blanket layer" may refer to a layer that is common across the active area of an OLED and/or is common to all of, or substantially all of, the OLEDs on a substrate. A blanket layer may be deposited through a mask that prevents material from depositing around the edges of the substrate (for example, in the area required for encapsulation or in areas requiring electrical contact from an external power supply or video signal). However, the deposition of a blanket layer generally does not involve deposition of materials onto the substrate through a mask that defines features on the substrate (such as individual pixels of one particular color), such as a Fine Metal Mask (FMM). In general, the mask used for blanket deposition does not need to be aligned to a degree of precision that exactly matches the deposition holes with the size of features (such as pixels) on the substrate.

As used herein, the term "comprising" is not intended to be limiting, but may be a transitional term synonymous with "including," "containing," or "characterized by." The term "comprising" may thereby be inclusive or open-ended and does not exclude additional, unrecited elements or method steps when used in a claim or describing embodiments. For instance, in describing a method, "comprising" indicates that the claim is open-ended and allows for additional steps. In describing a device, "comprising" may mean that a named element(s) may be essential for an embodiment, but other elements may be added and still form a construct within the scope of a claim or embodiment. In contrast, the transitional phrase "consisting of" excludes any element, step, or ingredient not specified in a claim or when describing an embodiment. This is consistent with the use of the term throughout the specification.

As used herein, "duv" is a general term that may be used to quantify the difference in chromaticity between different lighting devices (such as OLED displays or components of OLED displays). This can be quantified in terms of duv=sqrt $(\Delta u'^2+\Delta v'^2)$, where (u', v') are the coordinates of the different lighting devices in CIE 1976 (L*, u*, v*) color space chromaticity diagram. The CIE 1976 (L*, u*, v*) color space is used in preference over the CIE 1931 XYZ color space because in the CIE 1976 (L*, u*, v*) color space chromaticity diagram, distance is approximately proportional to perceived difference in color. An alternative name for the CIE 1976 (L*, u*, v*) color space chromaticity diagram is the CIE 1976 UCS (uniform chromaticity scale) diagram. The conversion between coordinates in these color spaces is very simple: u'=4x/(−2x+12y+3) and v'=9y/(−2x+12y+3), where (x, y) are the coordinates of the CIE 1931 XYZ color space chromaticity diagram.

As used herein, an "emissive region" of an OLED may refer to a portion of the device from which light may be emitted. The emissive region therefore may comprise not only the active area of the device, but also the electrodes and other layers or components of the device that may be disposed over a portion of the active area (or that the active area may be disposed over). A device may have one or more emissive regions, where each emissive region may emit light having different properties (e.g. the emissive spectrum, hue, brightness, etc. of light that is emitted from two different emissive regions or portions of the device may be different). A viewer looking at a device having two emissive regions may be able to view light that is emitted from both the first and the second emissive regions—that is, portions of a device that do not emit light that is visible to an external observer do not comprise an emissive region.

As used herein, "reflective" may refer to when an electrode or other layer or component reflects at least 80% of perpendicular light that is incident on its surface.

As used herein, "semi-transparent" may refer to when an electrode or other layer or component transmits greater than 20% but less than 70% of perpendicular light that is incident on its surface.

As used herein, "transparent" may refer to when an electrode or other layer or component transmits greater than 70% of perpendicular light that is incident on its surface.

A concern appreciated by those trained in the human aspects of general lighting is that large OLED light panels emitting uniform white light is not necessarily desirable. The low level, uniform light output tends to mimic a heavily overcast day and can therefore be depressing. It would therefore be advantageous in some instances to include some color, hue or brightness variation across a large light panel.

It is also well understood that it is difficult to demonstrate uniform emission across OLED pixels greater than approximately 2.0 cm×2.0 cm when using standard transparent conductive oxide (TCO) anodes (such as ITO or IZO). See Birnstock et al., *OLEDs—Road to Success*, (Novaled) OLED Lighting Design Summit (2009), the entire disclosure of which is incorporated herein by reference in its entirety; see also Tyan et al., *Topics on OLED Lighting*, (Novaled) OLED Lighting Design Summit (2009), the entire disclosure of which is incorporated herein by reference in its entirety. For large area OLED light panels, bus lines are therefore often used to transport charge from electrode contacts to the emissive area. See Levermore et al., *Phosphorescent OLEDs: Lighting the Way for Energy-Efficient Solid-State Light Sources*, J Soc. Inf. Disp., p. 18, Vol. 26, No. 10 (October 2010), which is incorporated herein by reference in its entirety. Although bus lines may provide an effective means of enhancing power efficacy and luminance uniformity, this is normally at the cost of reduced aperture ratio because there is normally no light emission from the organic materials disposed on top of the bus lines. An alternative approach is to connect multiple smaller OLED pixels in series. See Tyan et al., *Topics on OLED Lighting*, (Novaled) OLED Lighting Design Summit (2009). This approach may also be used to successfully improve power efficacy and luminance uniformity, but once again this is at the cost of reduced aperture ratio because in this configuration a proportion of the panel area is used to define the separate pixels and also for the series connections between pixels.

Some embodiments described herein may provide a simple and/or low cost means of adding tonal or color variation to an OLED light panel. This approach may have an additional benefit in that, in some instances, it may also be used to enable aperture ratio of 100% and to improve luminance uniformity. This may be achieved by controlling the reflectance or transmittance of the electrodes at different positions on the OLED light panel. One relatively straightforward means the inventors have found of achieving this is by patterning electrodes into areas of different reflectance or transmittance at different positions on the substrate of an OLED light panel. For example, a semi-transparent material (such as thin Ag) could be patterned through a shadow mask onto a transparent conductive electrode (such as an ITO anode). The reflectance of the anode would then be stronger where there is Ag disposed over ITO in comparison to where there is only ITO.

Embodiments provided herein may comprise an OLED light panel with brightness and/or color variation achieved by controlling the reflectance or transmittance of the electrodes at different positions on the panel. This approach may enable 100% aperture ratio in some instances, which is typically higher than can be achieved for equivalent panels that utilize bus lines or series connections. Some embodiments may also enable greater luminance uniformity than for equivalent panels without the use of any bus lines or series connections. Embodiments may thereby enable the electrodes to be deposited and patterned at low cost by, for example, vapor deposition through a shadow mask, which may avoid the use of photolithography in the fabrication process. The organic stack may also be common across the panel. However, embodiments are not so limited and any suitable fabrication process may be utilized.

As noted above, some embodiments provided herein may enable OLED light panels with 100% (or nearly 100%) aperture ratio. Some embodiments may also enable controlled brightness and/or color variation across OLED light panels by, for instance, controlling the micro-cavity effect of one or both electrodes.

The inventors have demonstrated exemplary embodiments experimentally on a series of 15 cm×15 cm OLED light panels. In particular, the inventors have demonstrated exemplary embodiments on (1) a bottom-emission panel, (2) a top-emission panel, and (3) a transparent panel. All exemplary panels were fabricated without the use of any photolithography, instead using vapor deposition through shadow masks. As noted above, this technique may allow for lower fabrication cost by reducing the number of processing steps, especially by removing the photolithography step, which is typically expensive and/or time consuming.

The following descriptions of the experimental devices that were prepared or fabricated by the inventors are provided for illustration purposes only and are not intended to be limiting. The specific choices of materials, components, and dimensions or amounts of materials are provided as examples, and any suitable materials and corresponding parameters may generally be utilized as may be appreciated by one of skill in the art after reading this disclosure.

1. Exemplary Bottom-Emission Panel Designs

Figure 3A:
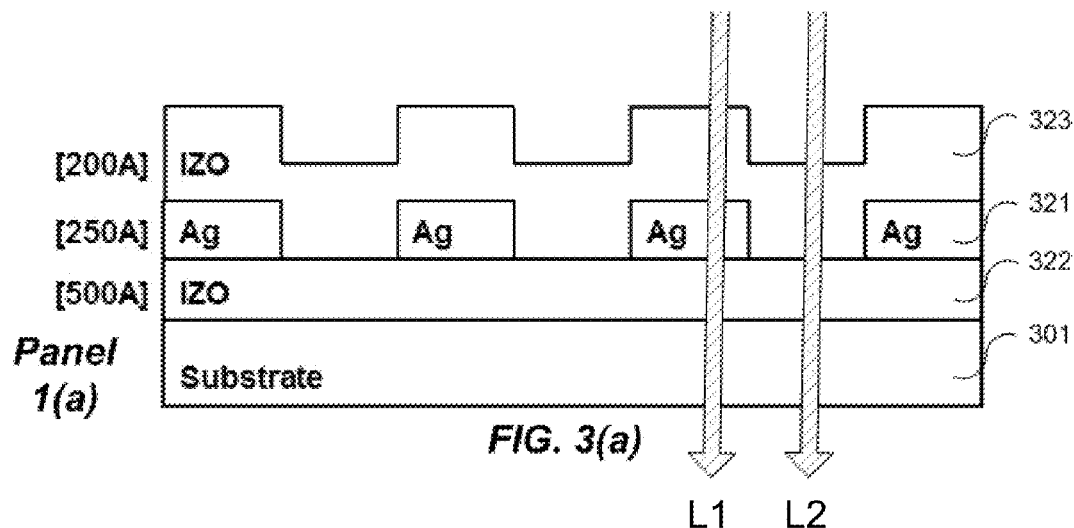
FIGS. 3(a)-(c) show cross-sectional views of the electrode of bottom-emission devices.
Figure 3B:
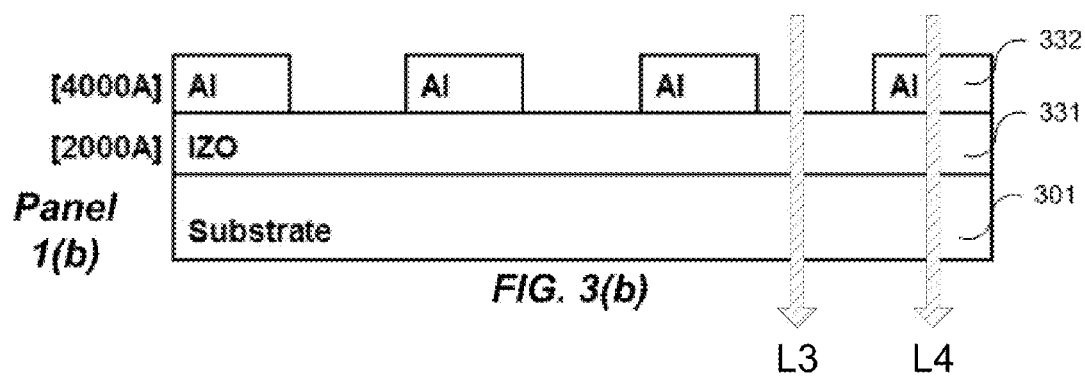
Figure 3C:
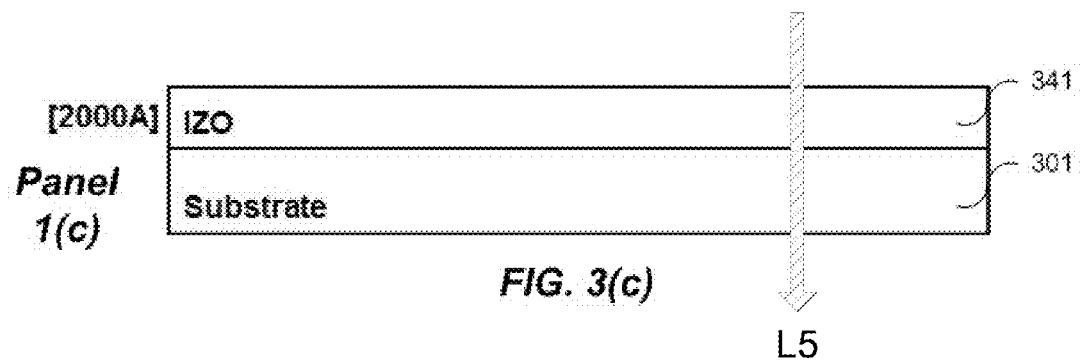

In a first exemplary device, the inventors demonstrated a bottom-emission OLED light panel in accordance with some embodiments. The exemplary panel design is shown in FIG. 3(a) ("Panel 1(a)"). FIG. 3(b) shows a first reference panel ("Panel 1(b)") and FIG. 3(c) shows a second reference panel ("Panel 1(c)"), which were each fabricated at the same time as exemplary Panel 1(a) shown in FIG. 3(a). It should be noted that for simplicity of illustration, FIGS. 3(a)-(c) depict only the substrate 301 and bottom electrode (comprising layers 321, 322, and 323 in FIG. 3(a); layer 331 and 332 in FIG. 3(b); and layer 341 in FIG. 3(c)) of each of the devices, and thereby do not show the organic layers and the top electrode of each of these devices.

The fabrication process for Panel 1(a) (shown in FIG. 3(a)) was as follows:

(1) A sheet (i.e. layer) of IZO 322 of thickness 500 Å was sputtered onto a 15 cm×15 cm soda lime glass substrate 301 of thickness=0.7 mm.

Figure 4:
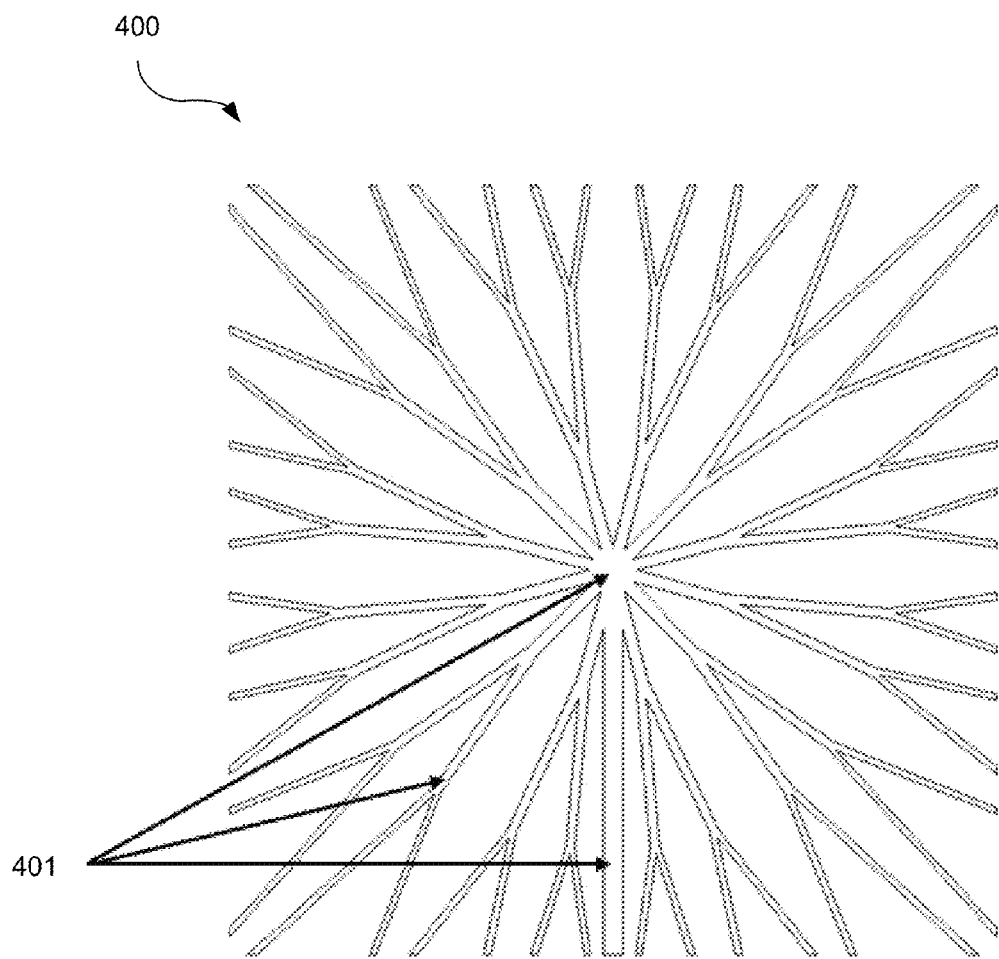
FIG. 4 shows an exemplary shadow mask for depositing a patterned layer of material in accordance with some embodiments.

(2) Semi-transparent Ag regions 321 of thickness 250 Å were deposited by VTE through a shadow mask. The exemplary shadow mask pattern 400 used for this process is shown in FIG. 4, which had openings 401 through which the Ag was deposited (which formed a branching type pattern of the Ag layer 321).

(3) A sheet of IZO 323 of thickness 200 Å was blanket sputtered onto the patterned layer of Ag 321 and the IZO layer 322. The IZO layers 322 and 323 and patterned Ag layer 321 comprise the bottom electrode in exemplary Panel 1(a) shown in FIG. 3(a).

Figure 5:
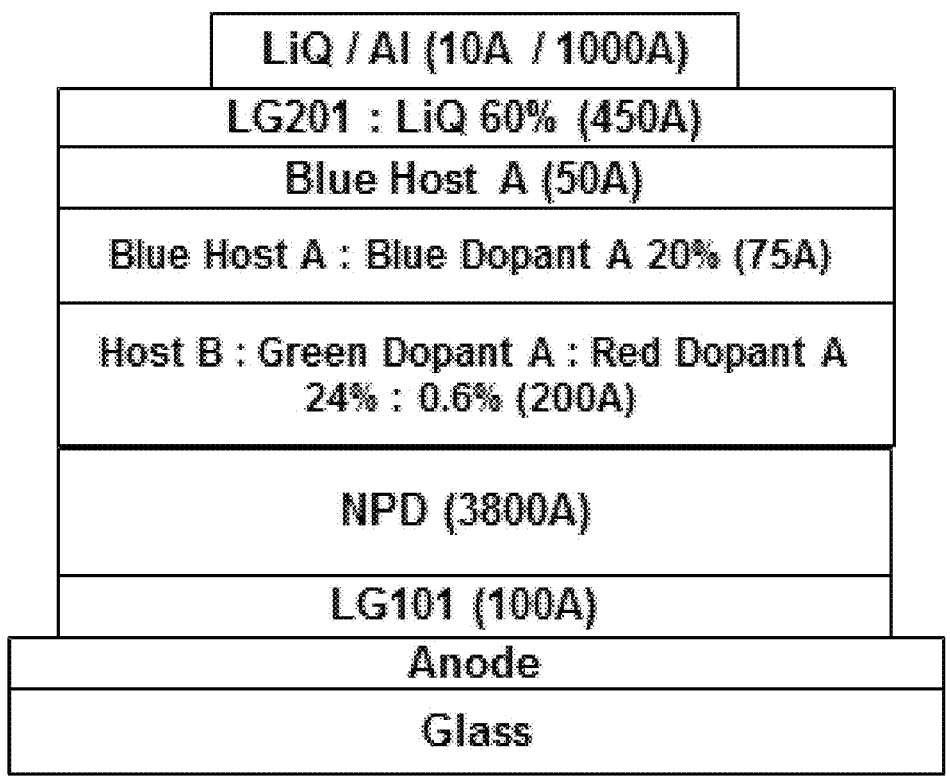
FIG. 5 shows an exemplary organic stack for exemplary devices fabricated by the inventors corresponding to the panels having the configurations shown in FIGS. 3(a)-(c).
Figure 6:
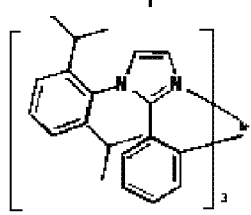
FIG. 6 shows exemplary structures of the chemical materials of the organic layers shown in FIG. 5 in accordance with some embodiments.
Figure 6:
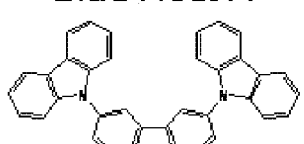
Figure 6:
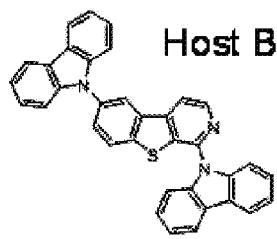
Figure 6:
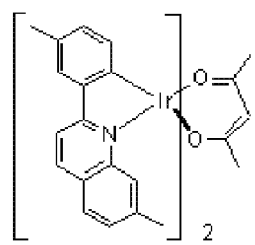
Figure 6:
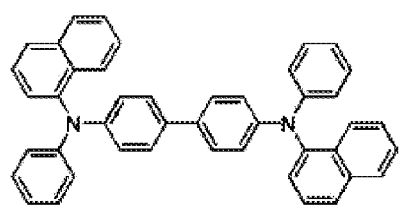
Figure 6:
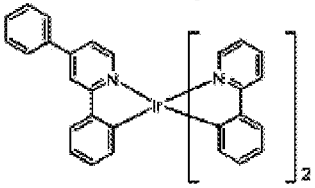

(4) The organic stack and cathode (neither of which is shown in FIG. 3(a)) were blanket deposited by VTE over the IZO layer 323. It should by understood that the organic layers could also be deposited using any suitable method, including by spin-coating, printing, OVPD, OVJP and/or other means. In this example, a blanket organic layer was deposited across the OLED light panel. However, embodiments are not so limited, and in some embodiments, the organic layers could be different at different locations on the panel. For example, HTL (hole transport layer) thickness could be varied to optimize the optical cavity length within areas where there is different electrode reflectance. The organic layer stack used for Panels 1(a)-(c) (shown in FIGS. 3(a)-(c), respectively) is shown in FIG. 5. The chemical materials that comprise these organic layers are shown in FIG. 6. However, as noted above, this device structure and materials are provided for illustration purposes only, and embodiments are not so limited.

Figure 9:
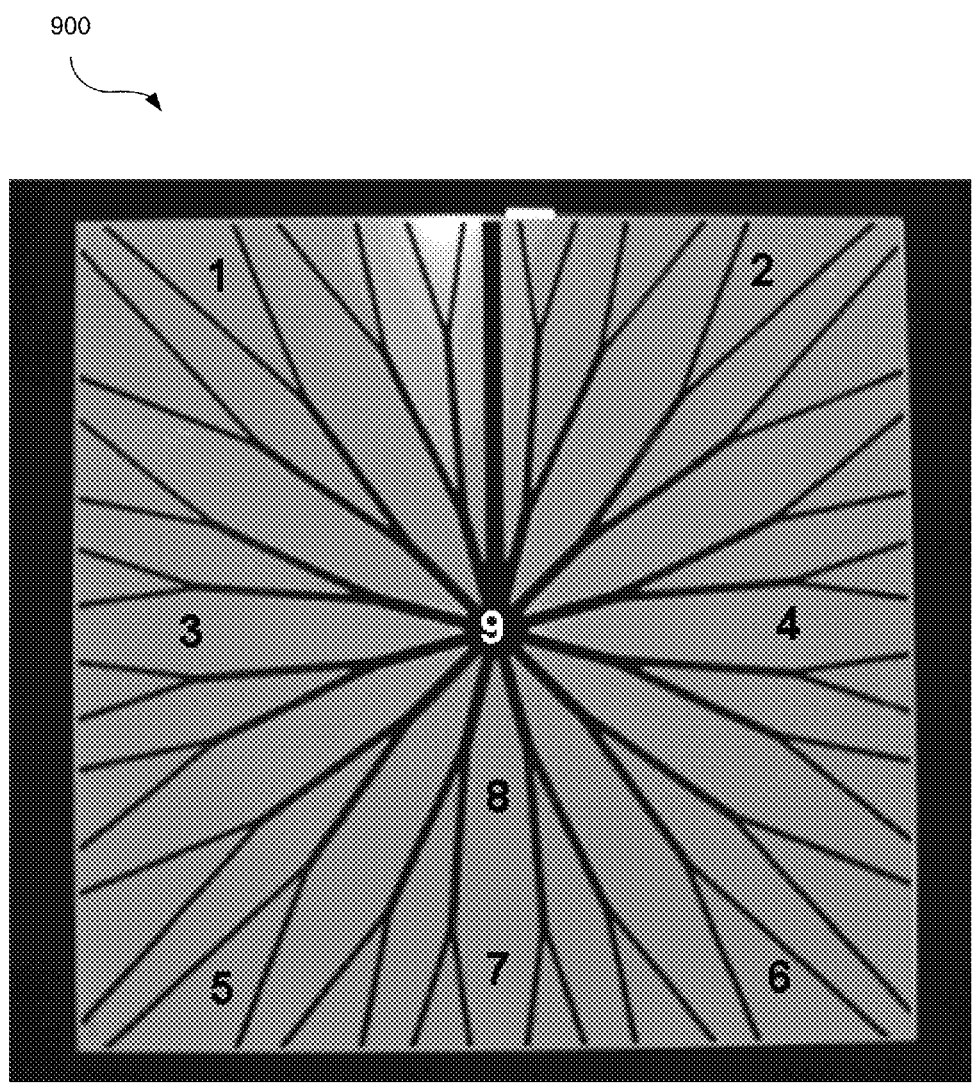
FIG. 9 is a photograph of a device fabricated by the inventors having a device structure corresponding to that shown in FIG. 3(b). The OLED light panel does not have emission from the bus line regions. The numbers correspond to points at which measurements of luminance and emission color were recorded. These measurements are summarized in Table 1 below.

Reference OLED light Panels 1(b) and 1(c) (shown in FIGS. 3(b) and (c), respectively) were prepared for comparison purposes. Reference Panel 1(b) comprises a uniform sheet of sputtered IZO 331 of thickness 2000 Å with Al bus lines 332 of thickness 4000 Å deposited by VTE through a shadow mask. The Al bus lines 332 were deposited in the same pattern as the Ag layer 321 of Panel 1(a), the result of which is shown in FIG. 9 and described in more detail below. Reference Panel 1(c) has only a uniform sheet of sputtered IZO 341 of thickness 2000 Å. A photograph of Panel 1(c) is provided in FIG. 10, and described below.

Sheet resistance (Rs) of the materials used in the exemplary Panels 1(a)-(c) are as follows: IZO [2000 Å] has Rs=20 Ohm/sq., Al [4000 Å] has Rs=0.05 Ohm/sq., IZO [500 Å]/Ag [250 Å]/IZO [200 Å] has Rs=1 Ohm/sq.

As shown in the exemplary panel in FIG. 3(a), Panel 1(a) has two different emissive regions (labeled as L1 and L2 in FIG. 3(a)). Emission from organic materials on top of the regions where the bottom electrode comprises IZO/Ag/IZO (i.e. emissive region L1) passes through the IZO (323)/Ag (321)/IZO (322) layers, which has relatively high reflectance ("R1"). Emission from organic materials elsewhere on the OLED light panel (i.e. emissive region L2 in FIG. 3(a)) passes through only IZO (i.e. layers 322 and 323) for the bottom electrode, which has a different and relatively low reflectance ("R2"). This difference in reflectance may result in the light emitted from each of the different emissive regions to have different optical properties, which may be controlled or tuned based on the parameters of the patterned layer.

Figure 7:
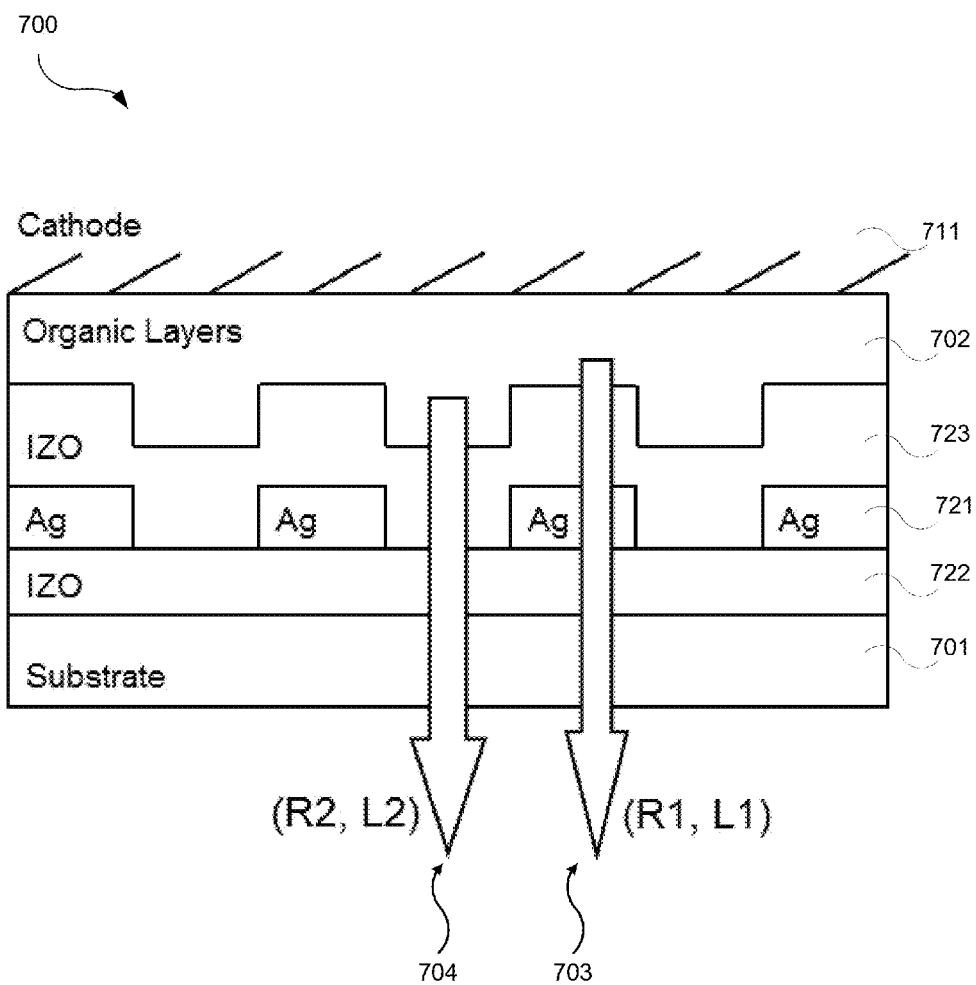
FIG. 7 shows a cross-sectional view of an exemplary bottom-emission device in accordance with some embodiments.

FIG. 7 provides another illustration of the exemplary Panel 1(a). In particular, as shown, the OLED panel in FIG. 7 comprises a substrate 701, a bottom electrode (e.g. second electrode) that comprises: a layer of IZO 722, a patterned layer of Ag 721 disposed over the IZO layer 722, and a second IZO layer 723 disposed over the patterned Ag layer 721 and the IZO layer 722; organic layers 702 disposed over the IZO layer 723; and a top electrode (e.g. first electrode) 711 that comprises the cathode of the device. As noted above, the device 700 is shown as having two emissive regions from which light is emitted. The first emissive region (L1) 703 emits light having properties based on the propagation through the second IZO layer 723, the Ag layer 721, and the first IZO layer 722, which results in a reflectance shown as R1. The second emissive region (L2) 704 emits light having properties based on the propagation through only the IZO layers 722 and 723 in this example, which results in a reflectance shown as R2.

In contrast, Panels 1(b) and (c) (shown in FIGS. 3(b) and (c), respectively) provide emission only through a layer of IZO (corresponding to emissive regions L3 and L5, respectively). Note that the Al bus lines 332 in Panel 1(b) shown in FIG. 3(b) are opaque and therefore light is not emitted from the corresponding regions L4 of this bottom-emission device (the arrow labeled L4 is provided for illustration purposes, and is not intended to indicate light emissions from this region). For all three of the exemplary panels manufactured by the inventors, the reflectance of the Al cathode (not shown) is constant. Note that for emission from an area of the OLED panel, both electrodes are charge injecting in that area, and at least one electrode is transparent or semi-transparent in the area.

As noted above, the OLED device stack for each of Panels 1(a)-(c) is shown in FIG. 5. The structures of the chemical materials of the layers are shown in FIG. 6. The exemplary stack includes red, green and blue phosphorescent emitters. In some embodiments, fluorescent emitters could also be used, though efficiency would likely be lower. As shown in FIG. 5, an exemplary OLED device stack may include a plurality of material layers. OLEDs may be fabricated on a glass substrate, and include, in order, an anode (examples of which were described above), a hole injection layer (e.g. 100 Å thick LG101, available from LG Chemicals of Korea), a hole transport layer (e.g. 3800 Å thick NPD), a first emissive layer (e.g. 200 Å thick Host B doped with 24% Green Dopant A and 0.6% Red Dopant A), a second emissive layer (e.g. 75 Å thick Blue Host A doped with 20% Blue Dopant A), a blocking layer (e.g. 50 Å thick Blue Host A), an electron transport layer (e.g. 450 Å thick layer of 40% LG201, available from LG Chemicals of Korea, and 60% LiQ), and a cathode (e.g. 10 Å thick layer of LiQ (lithium quinolate) and a 1000 Å thick layer of Al). As noted above, the foregoing materials and dimensions are provided merely by way of example, and should not be interpreted as limiting. Other configurations for the OLED and/or organic layers of the OLED are also contemplated and will be appreciated by those of skill in the art after reading this disclosure.

Figure 8:
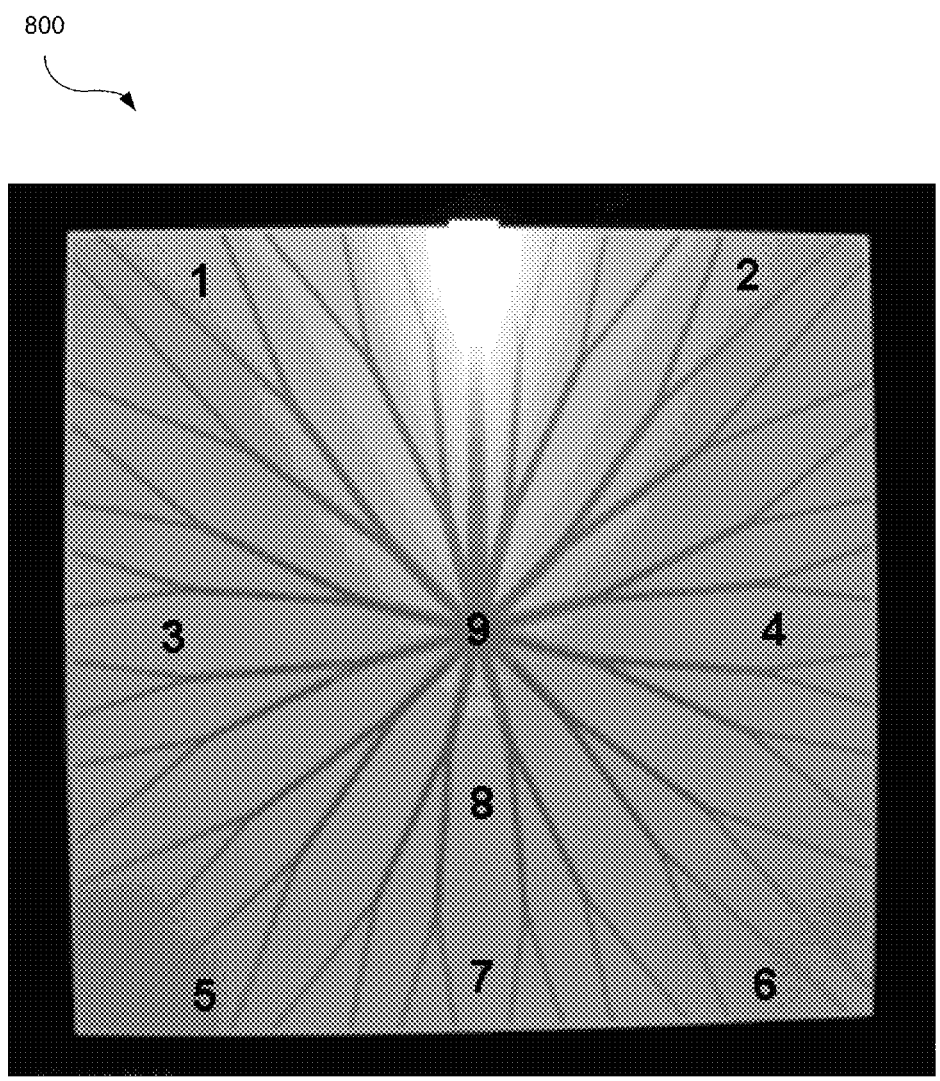
FIG. 8 is a photograph of an experimental device fabricated by the inventors having a device structure corresponding to that shown in FIGS. 3(a) and 7. The exemplary OLED light panel has 100% aperture ratio. The numbers correspond to points at which measurements of luminance and emission color were recorded. The measurements are summarized in Tables 1 and 2 below.

FIG. 8 shows a photograph of the exemplary Panel 1(a) having a structure corresponding to that shown in FIGS. 3(a) and 7. This exemplary panel 800 has 100% aperture ratio within the outline of the emissive area. Measurements of luminance and emission color were taken at normal incidence at nine different positions during operation at V=5.0 V and I=0.114 A (where the measurement positions are indicated by the numbers shown in FIG. 8). The data for these measurements is shown in Table 1 below. Positions 1-8 correspond to emission through the IZO layers 722 and 723 only (i.e. corresponding to the second emissive region 704 ("L2") in FIG. 7), while Position 9 corresponds to emission through the IZO 723/Ag 721/IZO 722 layers (i.e. corresponding to the first emissive region 703 ("L1") in FIG. 7). As shown in Table 1, for Positions 1-8, the luminance falls from a high of 319 cd/m² at Position 1 to a low of 196 cd/m² at Position 5. Uniformity across Panel 1(a) is therefore 61.4% across the IZO regions. Emission color at Positions 1-8 given by the CIE 1931 color space coordinates is a reasonable white color (with a greenish hue), and does not change significantly across the OLED light panel. In contrast, emission color at Position 9 of Panel 1(a) is bright pink (having CIE 1931 (x, y) coordinates of (0.537, 0.375)). This is because of the relatively strong microcavity effect provided by the IZO/Ag/IZO anode in the first emissive region, which is both charge injecting and semi-transparent. For comparison, measurements were taken at similar locations on exemplary Panel 1(b) (as shown in FIG. 3(b)) and Panel 1(c) (as shown in FIG. 3(c)) and are also provided in Table 1 below.

of 1,290 cd/m² at Position 1 to a low of 1,000 cd/m² at Position 6. Uniformity across Panel 1(b) is therefore 77.5% across the IZO regions. Emission color at Positions 1-8 was measured to be a reasonable white color (with a greenish hue), and does not change significantly across the OLED light panel. There is no emission at Position 9 (i.e. the light emissions corresponding to L4=0) because this panel uses opaque bus lines on one electrode, with opaque counter electrodes (not shown in FIG. 3(b)), so any light generated over the bus lines cannot emit at normal incidence. This is in contrast to the exemplary embodiment shown in FIG. 7, in which light is emitted in both the first emissive region L1 703 and the second emissive region L2 704.

Figure 10:
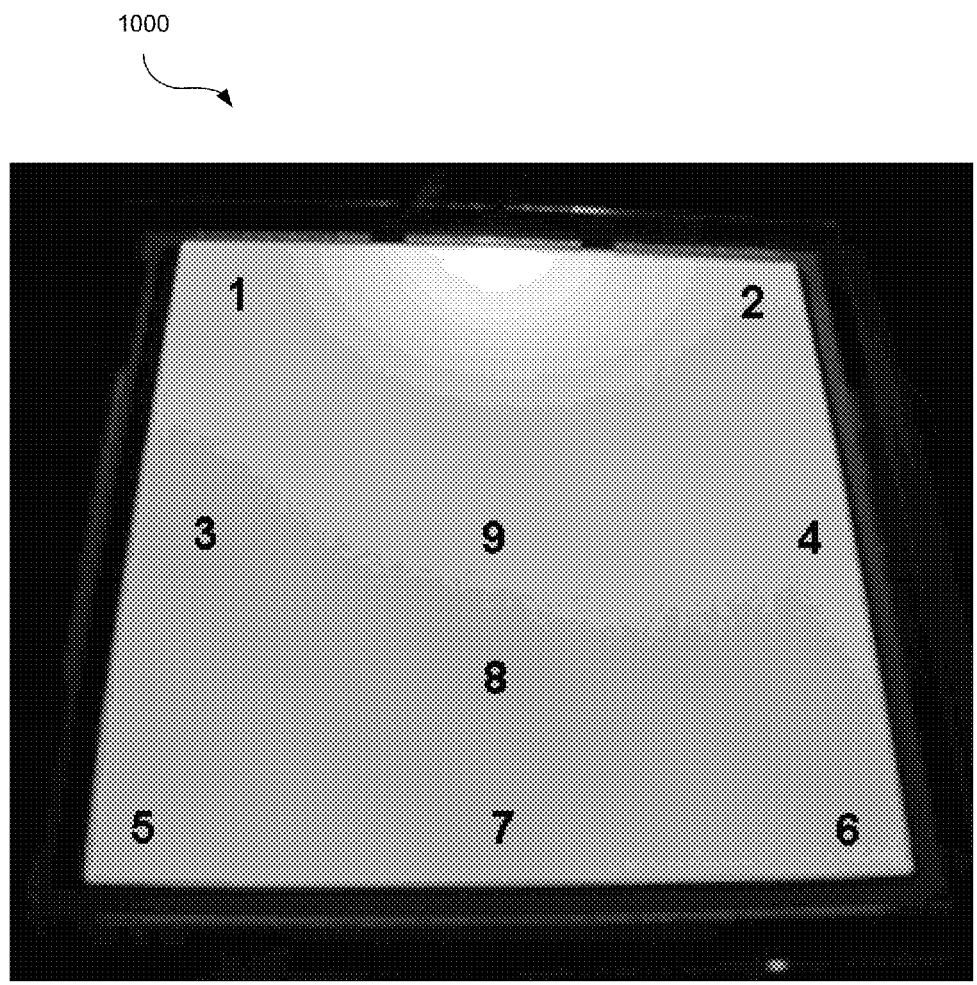
FIG. 10 is a photograph of a device fabricated by the inventors having a device structure corresponding to that shown in FIG. 3(c). The numbers correspond to points at which measurements of luminance and emission color were recorded. These measurements are summarized in Table 1 below.

FIG. 10 shows a photograph of the Panel 1(c) having the structure shown in FIG. 3(c). As described above, this panel has only an IZO region (L5) comprising layer 341. Measurements of luminance and emission color were taken at normal incidence at 9 different positions during operation at V=5.0 V and I=0.044 A (the positions are shown by the numerical labels in FIG. 10). The data for these measurements is shown in Table 1 above. Luminance falls from a high of 119 cd/m² at Position 2 to 52 cd/m² at Position 5. Uniformity across Panel 1(c) is therefore 43.7% across the IZO region. Emission is from a weak microcavity at all points. Emission color at Positions 1-9 is a reasonable white color with a greenish hue, and does not change significantly across the OLED light panel.

Based on the measurements performed by the inventors for the exemplary panels, it is clear that Panel 1(c), which has

TABLE 1

Luminance and emission color at Positions 1-9 on Panels 1(a), 1(b) and 1(c).
All measurements were taken at normal incidence and at V = 5.0 V.

| Position | Panel 1(a) | | Panel 1(b) | | Panel 1(c) | |
| --- | --- | --- | --- | --- | --- | --- |
| | Luminance [cd/m²] | CIE 1931 (x, y) | Luminance [cd/m²] | CIE 1931 (x, y) | Luminance [cd/m²] | CIE 1931 (x, y) |
| 1 | 319 | (0.325, 0.412) | 1,290 | (0.344, 0.438) | 101 | (0.326, 0.457) |
| 2 | 279 | (0.317, 0.413) | 1,200 | (0.349, 0.443) | 119 | (0.331, 0.468) |
| 3 | 230 | (0.320, 0.414) | 1,130 | (0.340, 0.432) | 58 | (0.331, 0.464) |
| 4 | 237 | (0.316, 0.416) | 1,080 | (0.348, 0.441) | 79 | (0.339, 0.470) |
| 5 | 196 | (0.316, 0.410) | 1,040 | (0.339, 0.433) | 52 | (0.327, 0.457) |
| 6 | 199 | (0.311, 0.411) | 1,000 | (0.345, 0.438) | 59 | (0.331, 0.464) |
| 7 | 226 | (0.325, 0.420) | 1,130 | (0.347, 0.454) | 55 | (0.349, 0.471) |
| 8 | 287 | (0.330, 0.424) | 1,300 | (0.361, 0.456) | 63 | (0.352. 0.472) |
| 9 | 126 | (0.537, 0.375) | 0 | — | 76 | (0.356, 0.472) |

FIG. 9 shows a photograph of Panel 1(b). This panel has IZO regions (corresponding to emissive region L3) and IZO/Al regions (labeled as L4 for illustration purposes, but as described above, this does not comprise an emissive region because light is not emitted). As noted above, the Al regions 332 were deposited through a shadow mask having similar openings to the mask used to deposit the Ag regions 321 of Panel 1(a) (e.g. corresponding to the opening 401 of shadow mask 400 shown in FIG. 4). Measurements of luminance and emission color were taken at normal incidence at nine different positions during operation at V=5.0 V and I=0.462 A. This data is shown in Table 1 above. Luminance falls from a high only an IZO region (corresponding to emissive region L5), has very poor uniformity and low luminance at V=5.0 V. This is because of the relatively high resistivity of the IZO anode 341. In contrast, the patterning of semi-transparent IZO/Ag/IZO regions in Panel 1(a) (corresponding to emissive region L1) increases average luminance at the same drive voltage because of the relatively high conductivity of the IZO/Ag/IZO regions, which helps to reduce resistive losses across the panel. This also improves uniformity. Although Panel 1(a) is not as uniform as Panel 1(b), which comprises the opaque Al bus lines 332, Panel 1(a) does provide the additional advantages of 100% aperture ratio and the ability to control emission color and intensity across the OLED light panel. This is shown in Table 1 by the difference between the emission color of the light emitted in Positions 8 and 9 on Panel 1(a).

In addition to the above, the emission from organic emitting materials disposed between electrodes with different reflectance can, in some embodiments, also be used to introduce controlled color variation with viewing angle (that is, the color of the light emissions may vary depending on the viewing angle). The inventors made such measurements for the exemplary Panel 1(a), which data is summarized in Table 2 below:

TABLE 2

Luminance and emission color at Positions 8 and 9 on OLED light Panel 1(a). All measurements were taken at V = 5.0 V.

| Measurement Angle | Panel 1(a) Measurement Position 8 L2 Region [IZO Region] | | Panel 1(a) Measurement Position 9 L1 Region [IZO/Ag/IZO Region] | |
|---|---|---|---|---|
| | Luminance [cd/m$^2$] | CIE 1931 (x, y) | Luminance [cd/m$^2$] | CIE 1931 (x, y) |
| 0° | 240 | (0.367, 0.470) | 215 | (0.448, 0.328) |
| 15° | 224 | (0.358, 0.478) | 191 | (0.447, 0.353) |
| 30° | 214 | (0.346, 0.487) | 184 | (0.429, 0.445) |
| 45° | 185 | (0.338, 0.461) | 171 | (0.337, 0.587) |
| 60° | 148 | (0.348, 0.409) | 146 | (0.252, 0.646) |

Figure 11A:
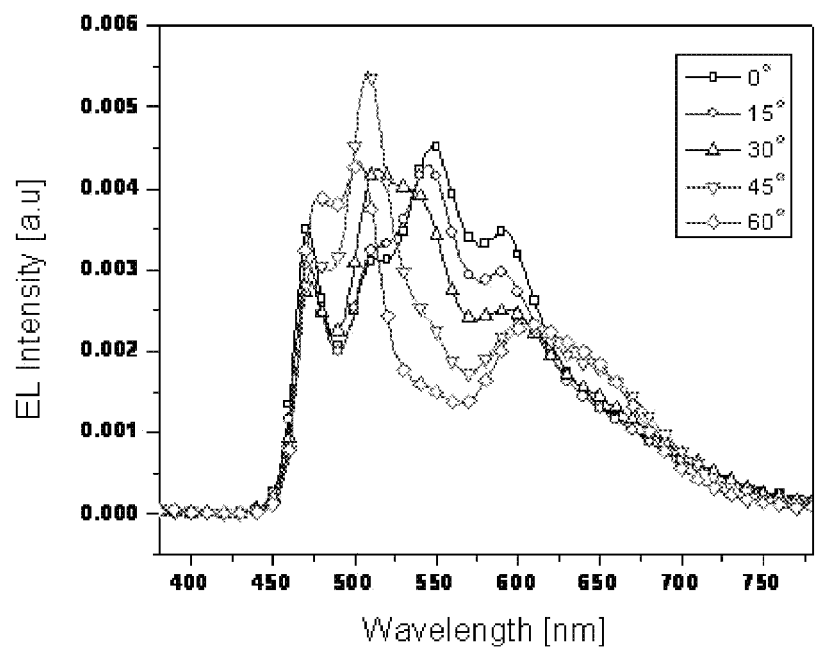
FIG. 11(a) shows a graph of the spectra of light emissions based on viewing angle at Position 8 of the exemplary panel shown in FIG. 8, which corresponds to the emissive region of that panel comprising IZO.
Figure 11B:
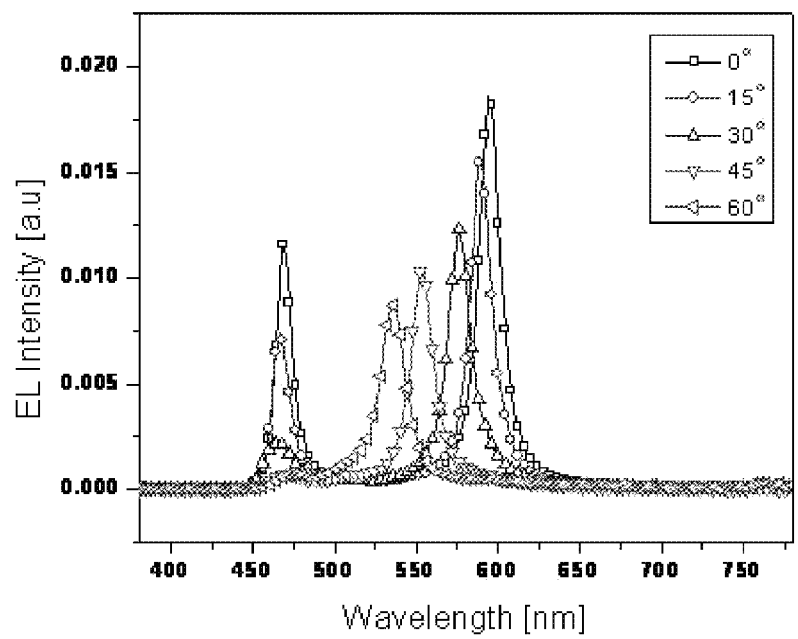
FIG. 11(b) shows a graph of the spectra of light emissions based on viewing angle at Position 9 of the exemplary panel shown in FIG. 8, which corresponds to the emissive region of that panel comprising IZO/Ag/IZO.

EL spectra were recorded at Positions 8 and 9 at normal incidence and also at angles of 15°, 30°, 45°, and 60°. At Position 8, where there is an IZO anode (i.e. corresponding to emissive region L2 704), although there is a slight color shift with viewing angle, emission color generally remains approximately white, as expected for a weak microcavity. The spectra at Position 8 for different viewing angles are shown in the graph provided in FIG. 11(*a*). At Position 9, where there is an IZO/Ag/IZO anode, there is an extremely strong color shift with viewing angle, as expected for a strong microcavity. For example, at normal incidence, emission is bright pink, as characterized by the two very narrow emission peaks at 468 nm (light blue) and 594 nm (red), shown in FIG. 11(*b*). At viewing angles away from normal incidence, the length of the optical cavity is effectively increased. This leads to the optical cavity being optimized for different wavelengths. As the viewing angle approaches 60°, light blue and red peaks are almost completely suppressed, and replaced by a narrow emission peak at 536 nm (green). The result of this is that at normal incidence, exemplary Panel 1(a) has the appearance of a white panel with bright pink patterned bus lines, while at a viewing angle of 60°, Panel 1(a) has the appearance of a white panel with bright green bus lines. This controlled color variation adds detail and texture to the OLED light panel in this example. Other color shifts can readily be demonstrated and achieved based on this disclosure and by controlling the microcavity effect of the panel, as would be appreciated by one of skill in the art. This color shift with viewing angle is particularly well suited to use with flexible substrates, as color shift and changes in intensity may be observed as the substrate is flexed to different angles.

Figure 12:
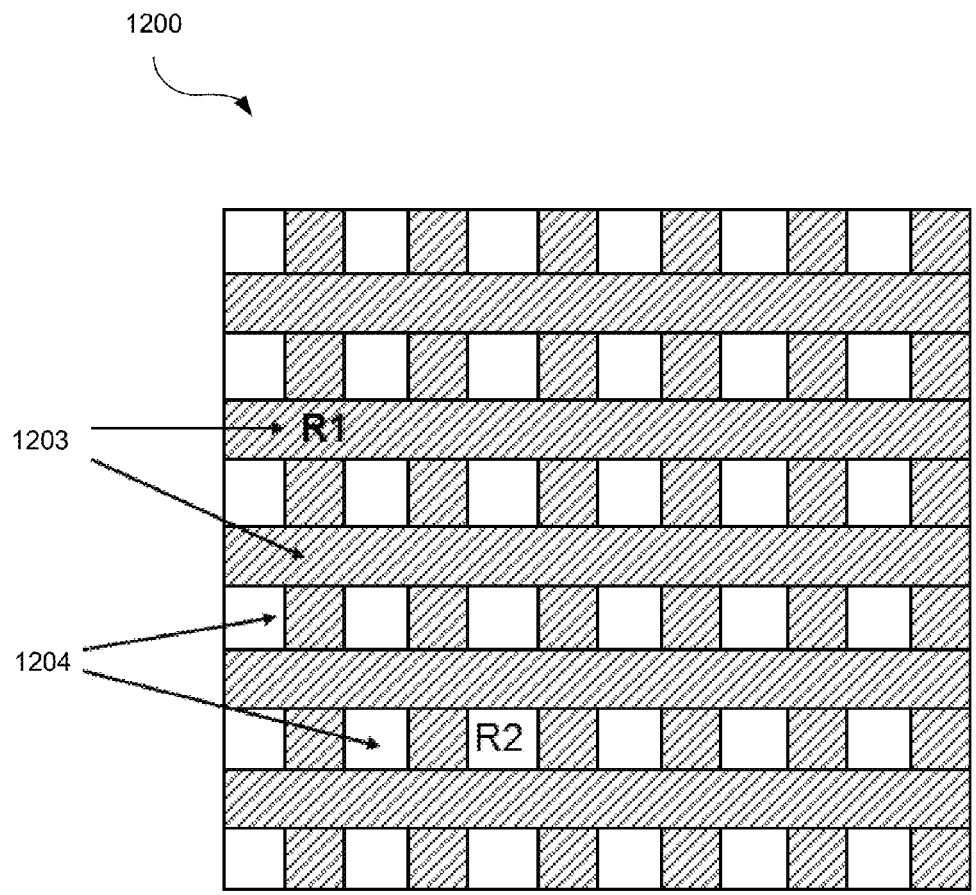
FIG. 12 shows an exemplary configuration of an electrode comprising a patterned layer of material disposed in the shape of a grid pattern in accordance with some embodiments. The shaded areas correspond to areas where there is emission (from region L1 in FIG. 3(a)) through semi-transparent, higher reflectance electrodes (having reflectance R1). The non-shaded areas correspond to areas where there is emission (from emission region L2 in FIG. 3(a)) through transparent, lower reflectance electrodes (having reflectance R2). This layout may enable a two-tone textured OLED light appearance in some embodiments and/or provide a device having lower resistive losses than an equivalent OLED light panel with only transparent electrodes.

In the example discussed above, a decorative lighting flower pattern shown in FIG. 4 was used to demonstrate the experimental embodiment (that is, the layer of the bottom electrode comprising Ag was deposited in the shape of a flower). Another embodiment of a lighting panel 1200 is shown in FIG. 12. Here, instead of a lighting flower, a grid pattern is shown comprising a first emissive region 1203 having reflectance R1 (corresponding to the portions of the bottom electrode comprising the Ag layer) and a second emissive region 1204 having reflectance R2 (corresponding to the portions of the bottom electrode that do not comprise the Ag layer). This layout could improve the uniformity of the OLED light panel compared to an equivalent panel with only a TCO electrode (such as ITO or IZO), such as Panel 1(c) shown in FIG. 3(*c*). Such an exemplary layout as shown in FIG. 12 may also add texture and detail to the lighting panel, which may be more desirable than just a uniform sheet of diffuse light (e.g. for at least the reasons noted above regarding the "grey sky" effect). It should be appreciated that any suitable pattern of the conductive layer(s) may be utilized, which may depend on and/or be chosen based on the application or intended use of the device.

In the exemplary Panel 1(a) discussed above, a blanket organic layer was deposited across the OLED light panel. However, embodiments are not so limited. For example, in other embodiments, the organic layers could be different at different locations on the panel. For example, an extra HTL (hole transport layer) thickness could be deposited over the different electrode regions so as to optimize the cavity length depending on the reflectance of the electrodes and the required or desired emission color of light from that emissive region.

Although exemplary devices and configurations were described above (particularly with reference to Panel 1(a)), embodiments are not so limited and in general the patterned and/or unpatterned layers of one (or both) electrodes may be configured in any suitable manner in accordance with some embodiments. For example, FIG. 13(*a*) shows a schematic cross-section of the bottom-emission panel design used for the exemplary Panel 1(a) described above. As shown, the OLED comprises a transparent substrate 1301, a bottom electrode comprising: a transparent conductive blanket layer 1322 (e.g. IZO), a patterned semi-transparent conductive layer 1321 (e.g. Ag) disposed over the conductive blanket layer 1322, and a blanket transparent conductive material 1323 (e.g. IZO) disposed over the conductive blanket layer 1322 and the patterned conductive layer 1321; an organic emitting layer (EML) 1302 disposed over the blanket transparent conductive material 1323; and a top electrode 1311 comprising a reflective conductive material (e.g. Al) disposed over the organic layer 1302. As shown, this embodiment may comprise two emissive regions: a first emissive region 1303 corresponding to the portions of the device where the patterned layer of conductive material 1321 is disposed (e.g. having IZO/Ag/IZO electrode), and a second emissive region 1304 corresponding to portions of the device where the patterned layer of conductive materials 1321 is not disposed (e.g. having only an IZO electrode).

FIG. 13(*b*) shows another bottom-emission architecture in accordance with some embodiments, where semi-transparent (higher reflectance) anode material 1321 is disposed directly onto the substrate 1301. That is, for example, the embodiment shown in FIG. 13(*b*) comprises a transparent substrate 1301, a bottom electrode comprising: a patterned semi-transparent conductive layer 1321 (e.g. Ag) disposed over the substrate 1301 and adjacent thereto, and a blanket transparent conductive material 1322 (e.g. IZO) disposed over the patterned conductive layer 1321 and the substrate 1301 (and adjacent to portions of the substrate 1301); an organic emitting layer (EML) 1302 disposed over the blanket transparent conductive material 1322; and a top electrode 1311 comprising a reflective conductive material (e.g. Al) disposed over the organic layer 1302. As shown, this embodiment may also comprise two emissive regions: a first emissive region 1303 corresponding to the portions of the device where the patterned layer of conductive material 1321 is disposed (e.g. having IZO/Ag electrode), and a second emissive region 1304 corresponding to portions of the device where the patterned layer of conductive materials 1321 is not disposed (e.g. having an IZO electrode). This embodiment may provide the advantage of reducing the number of deposition steps in the fabrication process because unlike the embodiment shown in FIG. 13(*a*), only a single blanket layer of conductive material is deposited for the bottom electrode.

Another exemplary embodiment is shown in FIG. 13(*c*), where semi-transparent (higher reflectance) anode material is deposited across the entire substrate, but patterned to different thicknesses. That is, for example, the embodiment shown in FIG. 13(*c*) comprises a transparent substrate 1301, a bottom electrode comprising: a patterned semi-transparent conductive layer 1321 (e.g. Ag) disposed over the substrate 1301 and adjacent thereto, where the semi-transparent material may be disposed across the entire emissive area of the device but in varying thicknesses, and a blanket transparent conductive material 1322 (e.g. IZO) disposed over the patterned conductive layer 1321; an organic emitting layer (EML) 1302 disposed over the blanket transparent conductive material 1322; and a top electrode 1311 comprising a reflective conductive material (e.g. Al) disposed over the organic layer 1302. As shown, this embodiment may also comprise two emissive regions: a first emissive region 1303 corresponding to the portions of the device where the patterned layer of conductive material 1321 has a first thickness, and a second emissive region 1304 corresponding to portions of the device where the patterned layer of conductive materials 1321 has a second thickness. It should be noted that in some embodiments, the patterned semi-transparent conductive layer 1321 may have a plurality of different thicknesses, which may be varied across the device to form a plurality of emissive regions in accordance with the intended application of the device. In general, embodiments corresponding to FIG. 13(*c*) may result in high conductivity across the entire substrate, and also in variation in reflectance depending on the thickness of the semi-transparent material. Moreover, this embodiment may be utilized to create the appearance of a continuous variation of the emissive properties of the device across the panel (e.g. by continuously varying the thickness of the patterned layer 1321).

Another exemplary embodiment of a bottom-emission device is shown in FIG. 13(*d*), where semi-transparent (higher reflectance) anode material 1321 is disposed onto a transparent anode. The semi-transparent anode material 1321 should be able to inject charge directly into the EML. That is, for example, the embodiment shown in FIG. 13(*d*) comprises a transparent substrate 1301, a bottom electrode comprising: a blanket transparent conductive material 1322 (e.g. IZO) disposed over the substrate 1301 and adjacent to the substrate 1301, and a patterned semi-transparent conductive layer 1321 (e.g. Ag) disposed over the blanket transparent conductive layer 1322; an organic emitting layer (EML) 1302 disposed over the patterned layer of conductive material 1321 and the transparent conductive material 1322 and adjacent thereto; and a top electrode 1311 comprising a reflective conductive material (e.g. Al) disposed over the organic layer 1302. As shown, this embodiment may also comprise two emissive regions: a first emissive region 1303 corresponding to the portions of the device where the patterned layer of conductive material 1321 is disposed (e.g. having Ag/IZO electrode), and a second emissive region 1304 corresponding to portions of the device where the patterned layer of conductive materials 1321 is not disposed (e.g. having IZO electrode).

It should be appreciated that there may be other combinations and/or configurations of the electrodes (including the disposition of the patterned layer and any other patterned or blanket conductive layers). Therefore, the above embodiments are not intended to be limiting, but are provided for illustration purposes.

2. Exemplary Top-Emission Panel Designs

Although the embodiments described above were generally directed to bottom-emission devices, some of the principles and configurations described therein may be equally applicable to other types of devices. For example, a second set of embodiments could comprise top-emission OLEDs. For top-emission OLEDs, a transparent or semi-transparent cathode would typically be used instead of a reflective cathode. Conversely the anode and/or underlying substrate should generally be highly reflective instead of transparent or semi-transparent. This architecture is particularly well suited to OLED panels fabricated on flexible metal foils.

Figure 14:
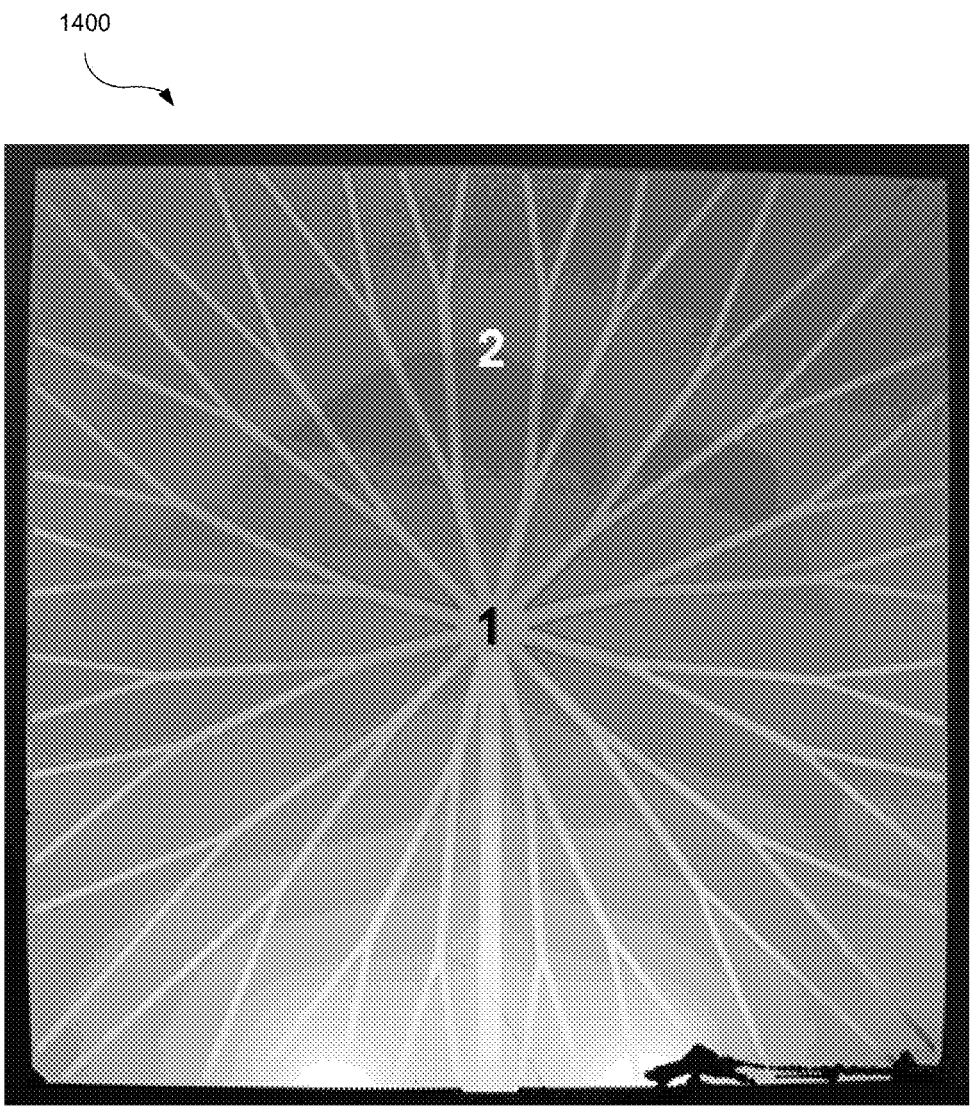
FIG. 14 is a photograph of an experimental top-emission device fabricated by the inventors in accordance with some embodiments. The exemplary OLED light panel has a 100% aperture ratio and is disposed on a flexible stainless steel foil substrate. The numbers correspond to points at which measurements of luminance and emission color were recorded. These measurements are summarized in Table 3 below.
Figure 15:
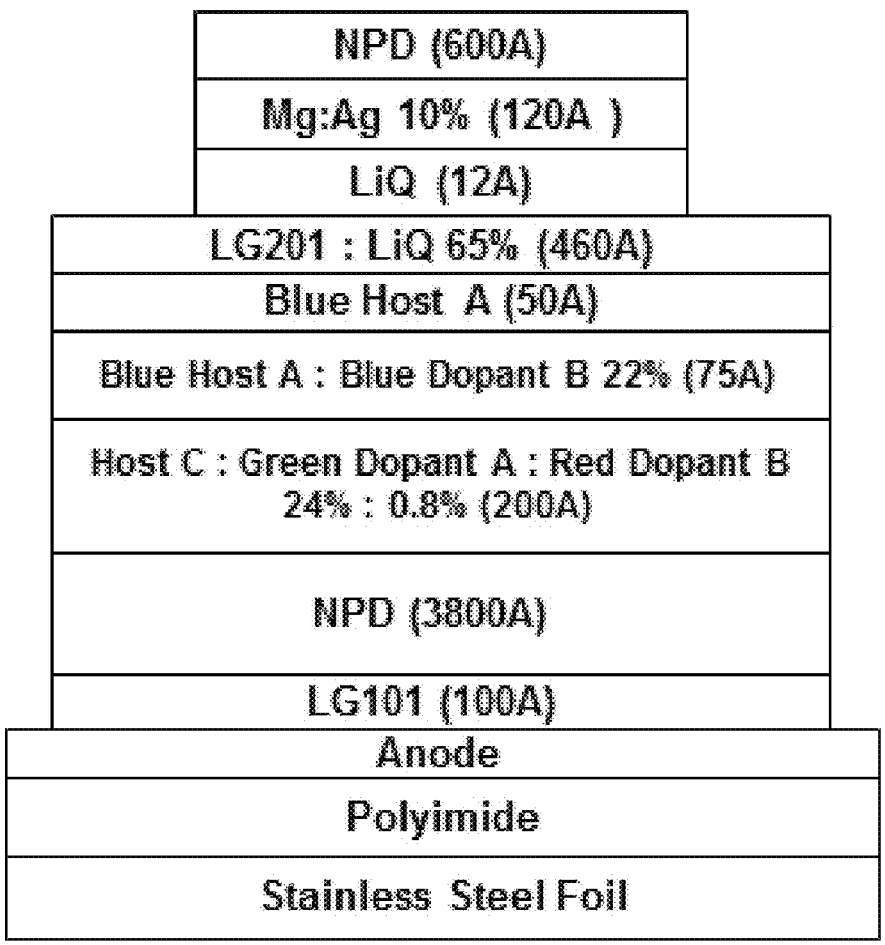
FIG. 15 shows an exemplary OLED device stack for the experimental device shown in FIG. 14 in accordance with some embodiments.

FIG. 14 is a photograph of a second exemplary panel ("Panel 2") fabricated by the inventors, which is a top-emission OLED fabricated on a 30-micron thick stainless steel foil substrate. An insulating polyimide layer of thickness of 10 microns was deposited across the entire panel prior to deposition of the anode. This ensures that the substrate remains reflective, but electrically inactive. It may also planarize the substrate. A blanket layer of IZO of thickness 2000 Å was sputtered onto the polyimide. A pattern layer of aluminum (Al) of thickness 2000 Å was then deposited by VTE through a shadow mask. The same shadow mask that was used for Panel 1(a) and Panel 1(b) was also used for Panel 2. This mask is shown in FIG. 4. The organic layers were then deposited by VTE. The organic stack for Panel 2 is shown in FIG. 15. However, it should be appreciated that the exact details of the organic stack are generally not important, though the structure is almost identical to that used for Panels 1 (a)-(c). For Panel 2, the semi-transparent cathode comprised of 120 Å Mg doped with 10% Ag, which was blanket deposited onto the organic layers. A 600 Å NPD was disposed on top of the MgAg cathode. This is to protect the MgAg cathode from being damaged when going through further processing, such as thin-film encapsulation.

Figure 16:
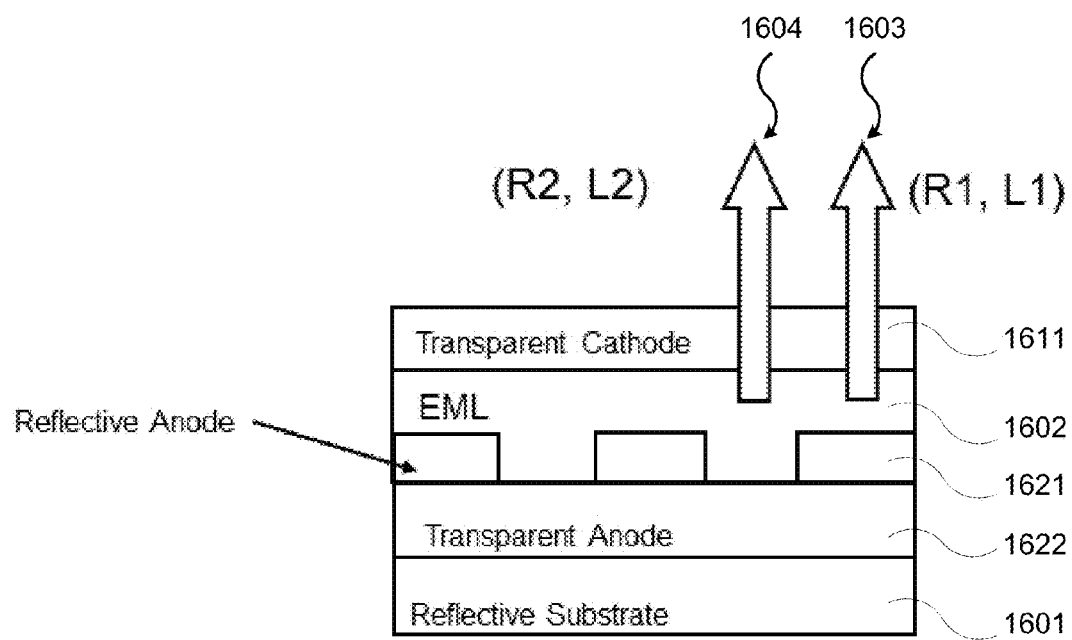
FIG. 16 shows a cross-sectional view of an exemplary device corresponding to the experimental device shown in FIG. 14 in accordance with some embodiments.

FIG. 16 shows a schematic drawing of the top-emission OLED architecture used for exemplary Panel 2. In this example, the OLED comprises a reflective substrate 1601 (e.g. metal foil substrate), a bottom electrode comprising: a blanket transparent conductive material 1622 (e.g. IZO) disposed over the substrate 1601 and adjacent to the substrate 1601, and a patterned reflective layer 1621 (e.g. Al) disposed over the blanket transparent conductive layer 1622; an organic emitting layer (EML) 1602 disposed over the patterned layer of conductive material 1621 and the blanket conductive layer 1622 and adjacent thereto; and a top electrode 1611 comprising a transparent conductive material (e.g. MgAg) disposed over the organic layer 1602. As shown, this embodiment may also comprise two emissive regions: a first emissive region 1603 corresponding to the portions of the device where the patterned layer of conductive material 1621 is disposed, and a second emissive region 1604 corresponding to portions of the device where the patterned layer of conductive materials 1621 is not disposed. That is, for light that is emitted substantially perpendicular to the substrate 1601 by the EML layer 1602 in the emissive region 1603, this light is reflected by the patterned reflective conductive material 1621 adjacent to the EML layer 1602; whereas light that is emitted substantially perpendicular to the substrate 1601 from the EML layer 1602 in the emissive region 1604 is not reflected until it reaches the substrate 1601, thereby resulting in a different microcavity effect on a large proportion of the light that is emitted normal to the substrate 1601 in these two emissive regions. For the exemplary Panel 2 fabricated by the inventors, the steel/polyimide/IZO/Al region has reflectance R1 (corresponding to emissive region 1603), and the steel/polyimide/IZO region has reflectance R2 (corresponding to emissive region 1604), where R1>R2.

Experimental Panel 2 was illuminated at 7.0 V with I=0.062 A. Luminance and CIE 1931 (x, y) coordinates were measured at two different positions, as shown by the labels in FIG. 14. Position 1 corresponds to a first emissive region where there is Steel/Polyimide/IZO/Al on the anode side (i.e. the first emissive region 1603 that includes a portion of the pattern layer of Al that was deposited through the shadow mask), while Position 2 corresponds to the second emissive region 1604 where there is Steel/Polyimide/IZO on the anode side. Measurements were taken at normal incidence (0°) and at 60° at both Position 1 and 2. The data from these measurements is shown in Table 3 below:

TABLE 3

Luminance and emission color at Positions 1 and 2 on OLED light Panel 2. All measurements were taken at V = 7.0 V.

| Measurement Angle | Panel 2 Measurement Position 1 L1 Region [Steel/Polyimide/IZO/Al] | | Panel 2 Measurement Position 2 L2 Region [Steel/Polyimide/IZO] | |
|---|---|---|---|---|
| | Luminance [cd/m$^2$] | CIE 1931 (x, y) | Luminance [cd/m$^2$] | CIE 1931 (x, y) |
| 0° | 50 | (0.449, 0.400) | 50 | (0.416, 0.456) |
| 60° | 70 | (0.335, 0.614) | 50 | (0.411, 0.448) |

As noted above, the design of the exemplary top-emission OLED panel (Panel 2) is such that reflectance of the anode varies across the substrate. In regions where there is Al 1621 deposited onto the IZO layer 1622, the anode reflectance (R1) is high because Al has relatively high reflectance (higher than the steel foil of the substrate 1601). In this emissive region (i.e. corresponding to emissive region 1603) the inventors observed white emission with a slight pink hue at normal incidence (having CIE 1931 (x, y) coordinates of (0.449, 0.400)), while at 60° from normal incidence, emission color was a saturated green (having CIE 1931 (x, y) coordinates of (0.335, 0.614)). This large color shift is expected for a strong optical cavity. In regions where there is only IZO deposited onto polyimide on steel foil, the anode reflectance (R2) is relatively low. This is because the stainless steel foil of the substrate 1601 has relatively poor reflectance and this reflectance is further reduced by the 10-micron thick polyimide layer. In this area (i.e. corresponding to emissive region 1604), the inventors observed approximately white emission with a slight green hue at normal incidence (having CIE 1931 (x, y) coordinates (0.416, 0.456)), with a very similar emission color when observed at 60° from the surface normal (having CIE 1931 (x, y) coordinates (0.411, 0.448)). This small color shift is as expected for a weak optical cavity.

Figure 17:
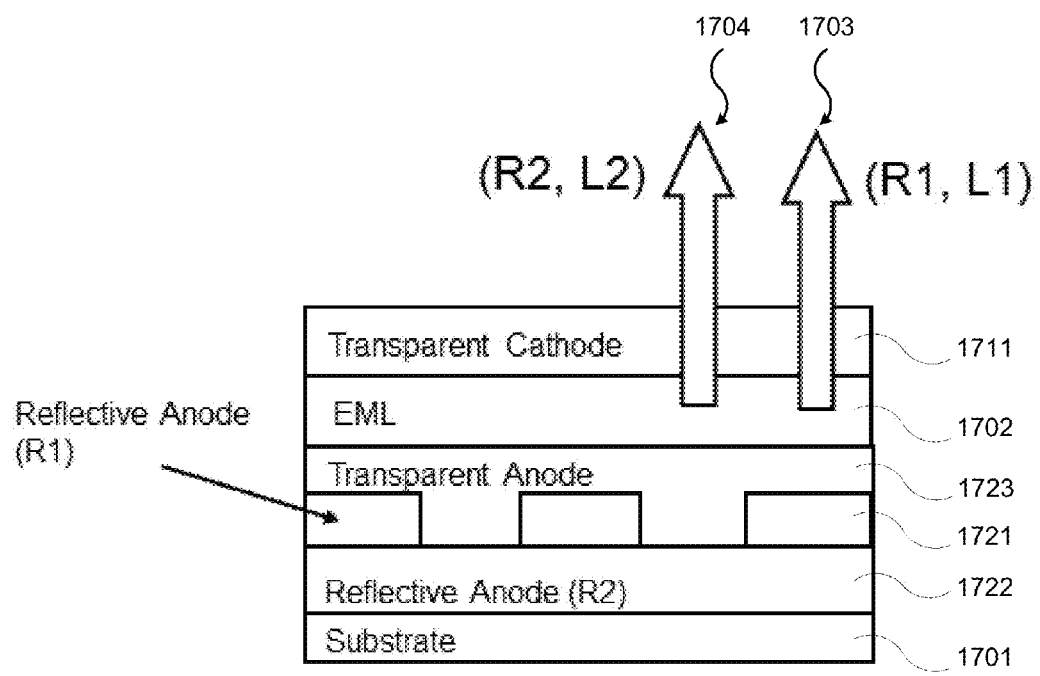
FIG. 17 shows a cross-sectional view of an exemplary top-emission device in accordance with some embodiments.

FIG. 17 shows a schematic of another embodiment of a top-emission OLED architecture, where a reflective anode material 1721 with reflectance R1 is disposed onto a reflective anode material 1722 with reflectance R2, and any kind of substrate 1701 can thereby be used. That is, for example, the embodiment shown in FIG. 17 comprises a substrate 1701 (which could be transparent, semi-transparent, opaque, or reflective), a bottom electrode comprising: a blanket reflective conductive material 1722 (having reflectance R2) disposed over the substrate 1701 and adjacent to the substrate 1701, a patterned reflective conductive layer 1721 (having reflectance R1) disposed over the blanket reflective conductive layer 1722, and a transparent conductive material 1723 disposed over the patterned conductive layer 1721 and the blanket conductive layer 1722; an organic emitting layer (EML) 1702 disposed over the transparent conductive layer 1723 and adjacent thereto; and a top electrode 1711 comprising a transparent conductive material disposed over the organic layer 1702. As shown, this embodiment may also comprise two emissive regions: a first emissive region 1703 corresponding to the portions of the device where the patterned layer of reflective conductive material 1721 is disposed (having reflectance R1), and a second emissive region 1704 corresponding to portions of the device where the patterned layer of reflective conductive material 1721 is not disposed (having reflectance R2).

Figure 18A:
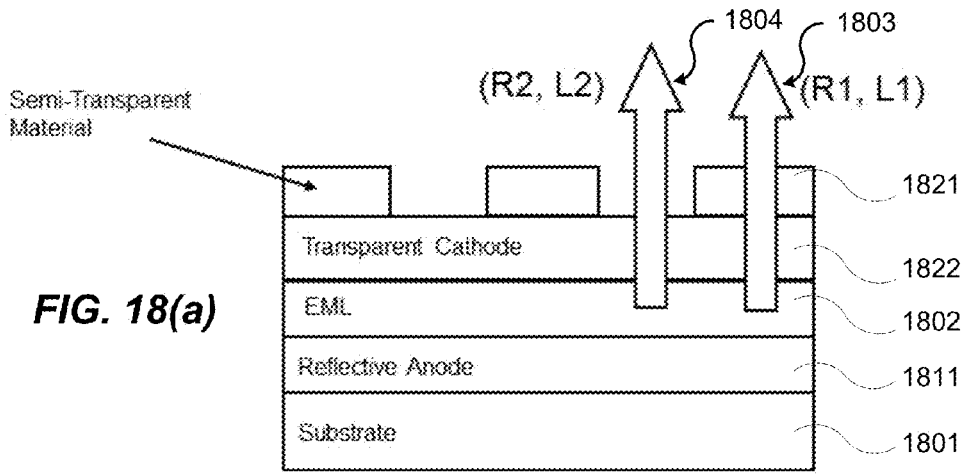
FIGS. 18(a)-(c) each shows a cross-sectional view of an exemplary top-emission device in accordance with some embodiments. In each of these exemplary embodiments, the reflectance of the cathode may be controlled by the patterned layer.
Figure 18B:
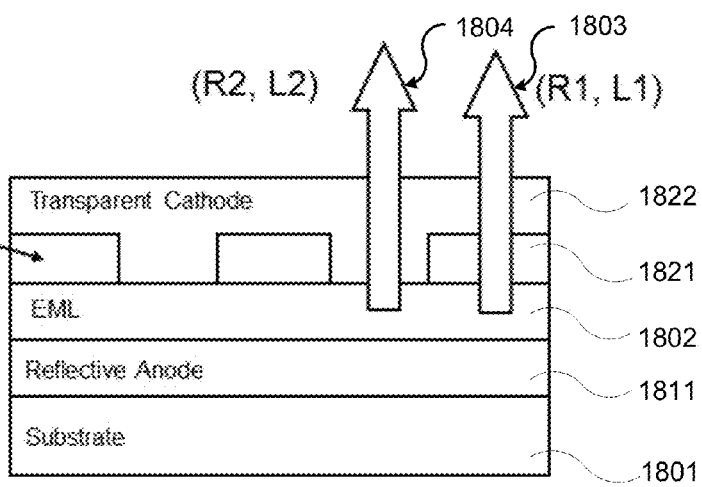
Figure 18C:
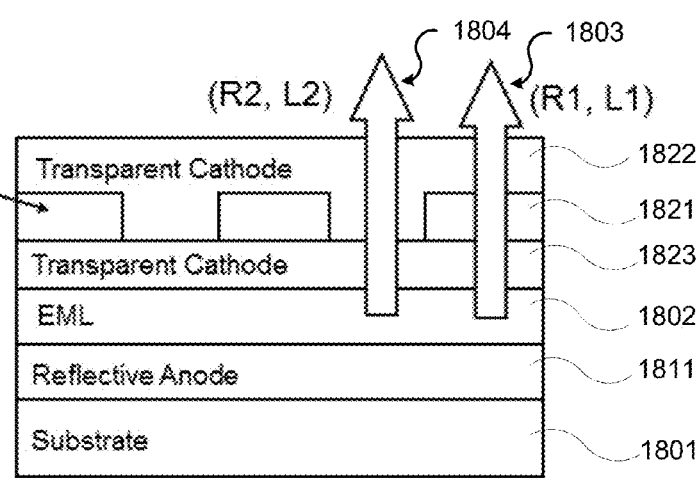

FIGS. 18(*a*)-(*c*) show additional exemplary embodiments of top-emission devices. As was noted above with reference to the bottom-emission embodiments, a person of ordinary skill in the art may understand after reading this disclosure that the layers and components of such devices may be modified and/or used in various combinations while still providing a device having emissive regions with varying transmittance/reflectance.

In this regard, FIG. 18(*a*) shows an embodiment of a top-emission OLED having a reflective anode 1811 that is blanket disposed onto any type of substrate 1801, and where the reflectance of the cathode layer is tuned. Note that in this example, the material on top of the cathode need not be conductive because the EML layers 1802 are disposed between two blanket conductive layers 1811 and 1822. However, embodiments in which the patterned layer 1821 is conductive may provide the advantage of more uniform distribution of current over the device by, for instance, reducing the sheet resistance of the cathode. As shown, the embodiment of FIG. 18(*a*) comprises a substrate 1801 (which could be transparent, semi-transparent, opaque, or reflective), a bottom electrode comprising a blanket reflective conductive material 1811 disposed over the substrate 1801 and adjacent to the substrate 1801; an organic emitting layer (EML) 1802 disposed over the reflective conductive layer 1811 and adjacent thereto; and a top electrode comprising: a transparent conductive material 1822 disposed over the organic layer 1802, and a patterned layer of material 1821 (preferably a conductive material that may be semi-transparent) disposed over the blanket transparent conductive layer 1822. As shown, this embodiment may also comprise two emissive regions: a first emissive region 1803 corresponding to the portions of the device where the patterned layer of material 1821 is disposed (having reflectance R1), and a second emissive region 1804 corresponding to portions of the device where the patterned layer of material 1821 is not disposed (having reflectance R2).

FIG. 18(*b*) shows another exemplary top-emission device in accordance with some embodiments that is similar to the device in FIG. 18(*a*) except that the blanket conductive layer 1822 of the top electrode is disposed over the pattered layer of semi-transparent material 1821. That is, as shown, the embodiment of FIG. 18(*b*) comprises: a substrate 1801 (which could be transparent, semi-transparent, opaque, or reflective), a bottom electrode comprising a blanket reflective conductive material 1811 disposed over the substrate 1801 and adjacent to the substrate 1801; an organic emitting layer (EML) 1802 disposed over the reflective conductive layer 1811 and adjacent thereto; and a top electrode comprising: a patterned layer of semi-transparent conductive material 1821 disposed over the organic layer 1802 and adjacent thereto, and a blanket layer of transparent conductive material 1822 disposed over the patterned layer of conductive material 1821 and the organic layer 1802. As shown, this embodiment may also comprise two emissive regions: a first emissive region 1803 corresponding to the portions of the device where the patterned layer of material 1821 is disposed (having reflectance R1), and a second emissive region 1804 corresponding to portions of the device where the patterned layer of material 1821 is not disposed (having reflectance R2).

FIG. 18(*c*) shows another exemplary top-emission device in accordance with some embodiments that is similar to the embodiment shown in FIG. 18(*b*) except that it includes an additional transparent conductive layer 1823 disposed between the pattern conductive layer 1821 and the organic layer 1802. That is, as shown, the embodiment of FIG. 18(*c*) comprises: a substrate 1801 (which could be transparent, semi-transparent, opaque, or reflective), a bottom electrode comprising a blanket layer of reflective conductive material 1811 disposed over the substrate 1801 and adjacent to the substrate 1801; an organic emitting layer (EML) 1802 disposed over the reflective conductive layer 1811 and adjacent thereto; and a top electrode comprising: a blanket layer of transparent conductive material 1823 disposed over the organic layer 1802, a patterned layer of semi-transparent conductive material 1821 disposed over the blanket transparent conductive layer 1823 and adjacent thereto, and a blanket layer of transparent conductive material 1822 disposed over the patterned layer of conductive material 1821 and the blanket layer of conductive material 1823. As shown, this embodiment may also comprise two emissive regions: a first emissive region 1803 corresponding to the portions of the device where the patterned layer of material 1821 is disposed (having reflectance R1), and a second emissive region 1804 corresponding to portions of the device where the patterned layer of material 1821 is not disposed (having reflectance R2).

Thus, as demonstrated above, the optical properties of light emitted in two different emissive areas may be controlled by changing the properties of either the anode (e.g. FIGS. 16 and 17) or the cathode (e.g. FIGS. 18(*a*)-(*c*)). As noted above, the examples provided herein are for illustration purposes, and a person of ordinary skill in the art would understand how to employ the techniques, devices, and components provided herein to obtain a device having a desired optical variance and/or related properties such as uniformity across the panel or low aperture ratio.

3. Exemplary Transparent Panel Designs

A third exemplary design could comprise the use of transparent OLEDs in accordance with some embodiments. While many design features and combinations described above may be applicable to such embodiments, in general, for transparent OLEDs, regions of both electrodes are transparent or semi-transparent.

Figure 19A:
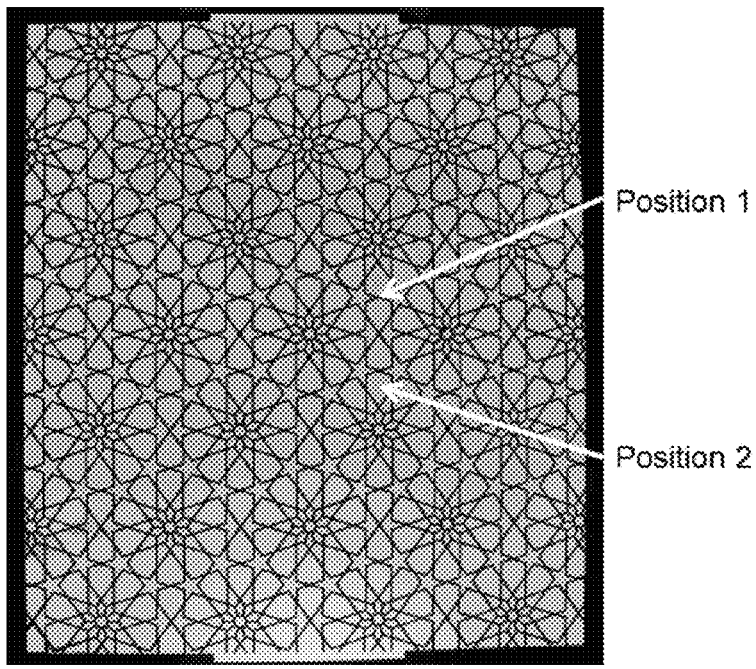
FIGS. 19(a) and (b) are photographs of an experimental transparent OLED panel fabricated by the inventors in accordance with some embodiments.
Figure 19B:
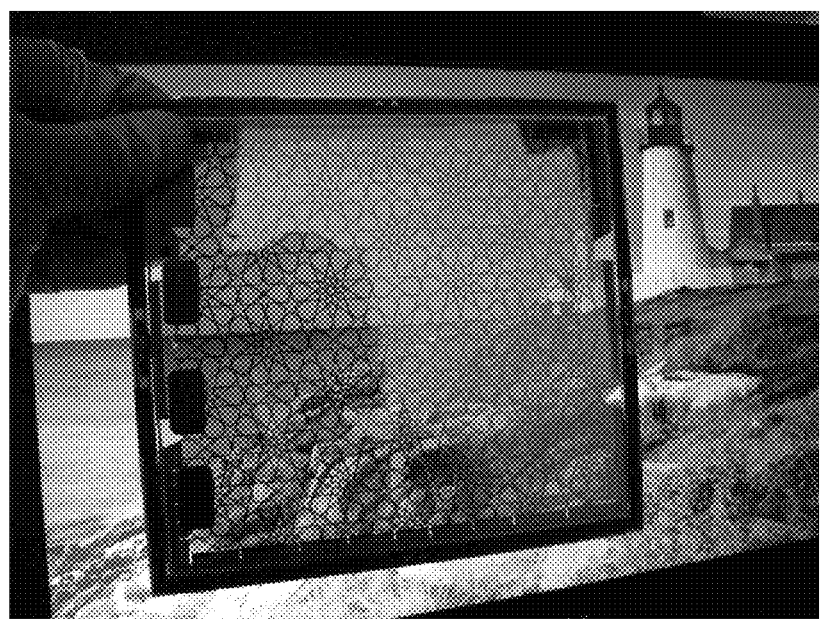
FIG. 19(b) shows the device when not illuminated.
Figure 20:
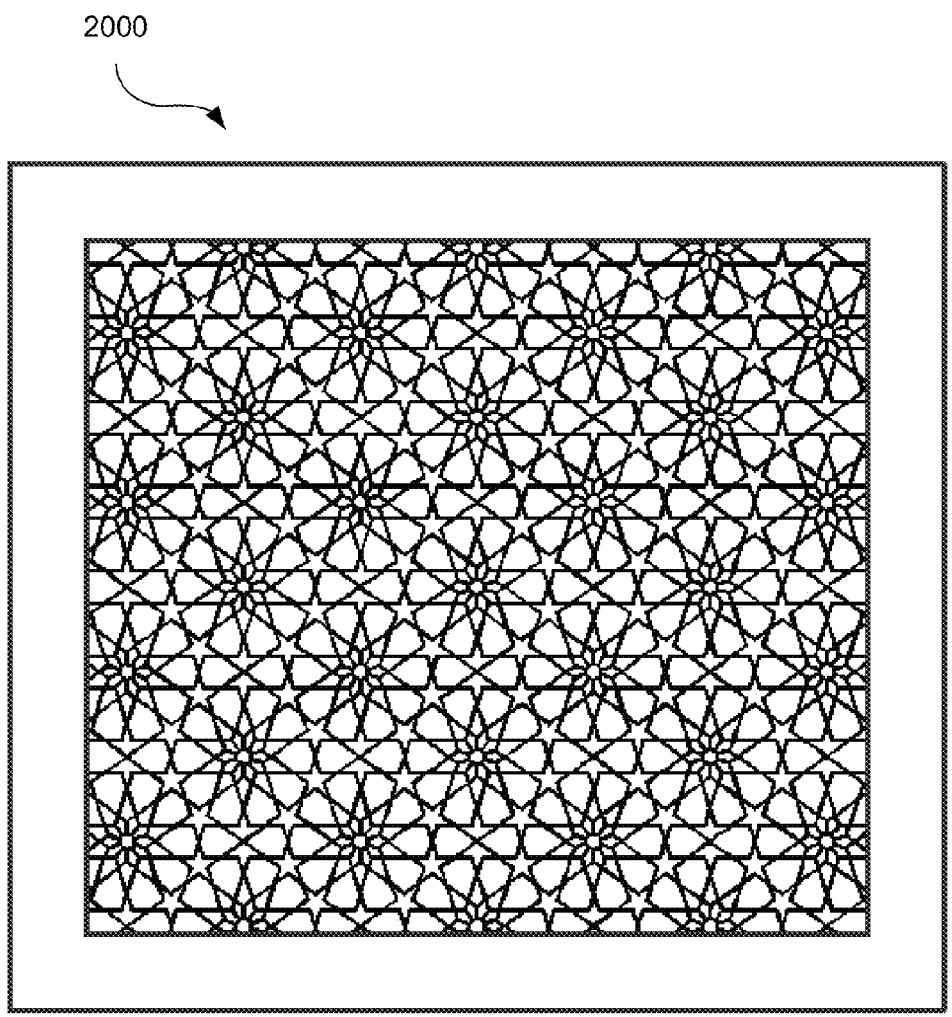
FIG. 20 shows a shadow mask design used for depositing a patterned layer of material for the experimental device shown in FIGS. 19(a) and (b). In this example, the pattern is achieved using a combination of two shadow masks.
Figure 21:
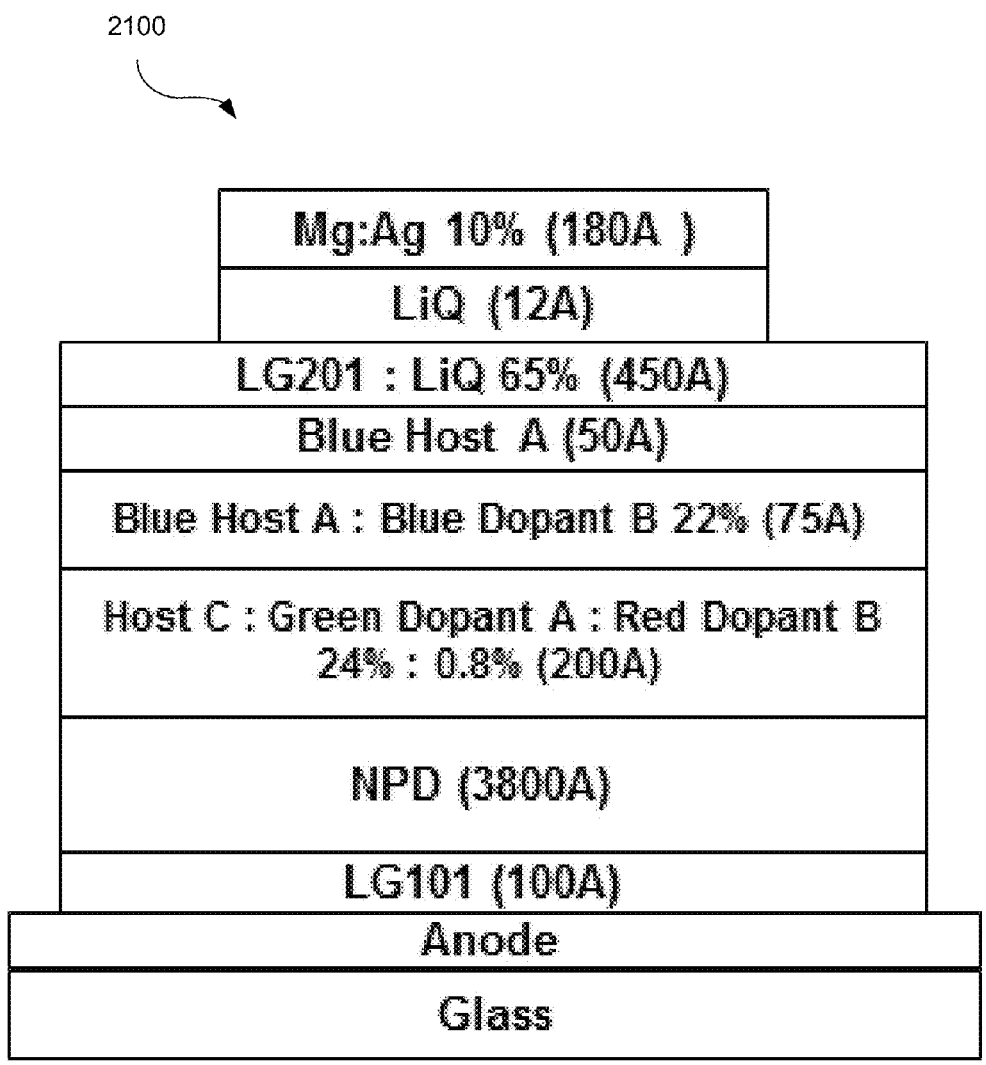
FIG. 21 shows an exemplary organic stack for the device fabricated by the inventors shown in FIGS. 19(a) and (b) in accordance with some embodiments.
Figure 22:
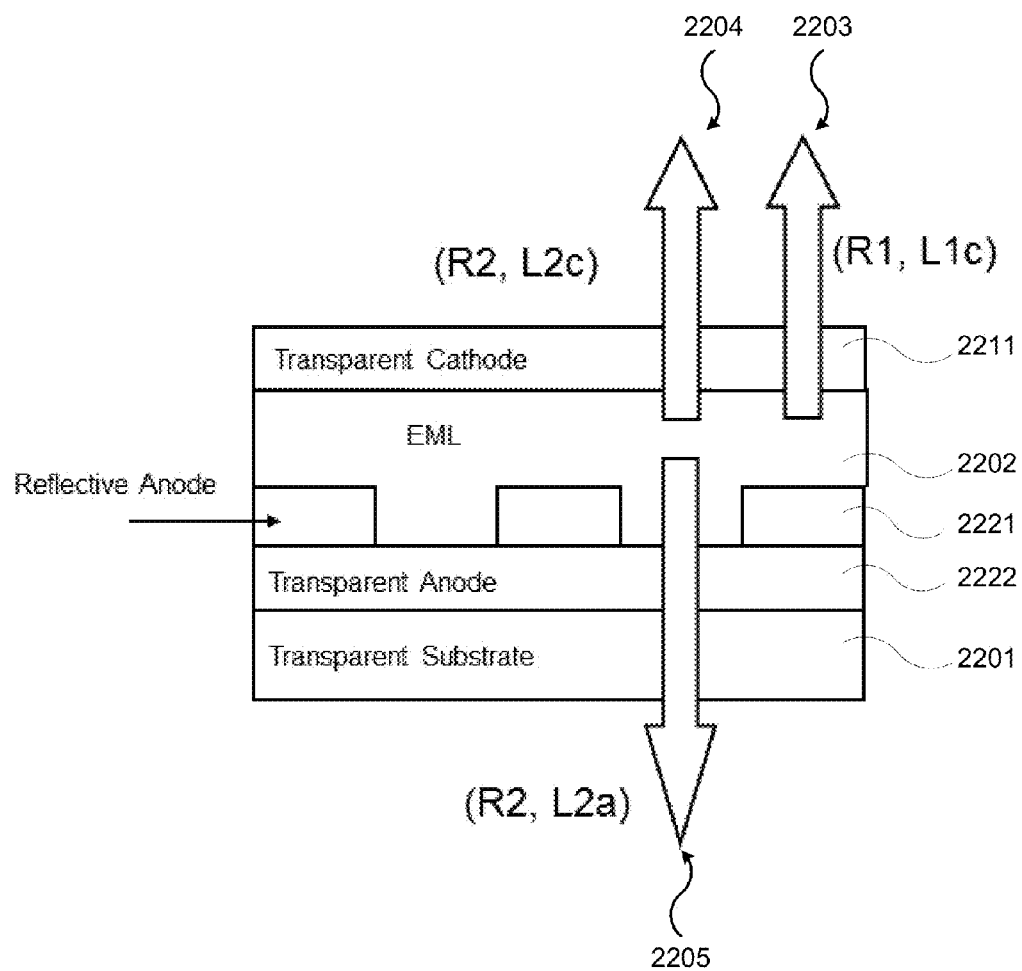
FIG. 22 shows a cross-sectional view of an exemplary transparent OLED architecture in accordance with some embodiments.

FIGS. 19(*a*) and (*b*) are photographs of a third exemplary panel fabricated by the inventors ("Panel 3"), which was a transparent OLED panel fabricated on a 0.7 mm thick glass substrate. FIG. 19(*a*) shows the exemplary panel while illuminated. FIG. 19(*b*) shows the panel while not illuminated. A blanket layer of IZO of thickness 2000 Å was sputtered onto the substrate. Aluminum was then deposited by VTE through two shadow masks (although embodiments are not so limited). Where the deposition through each of the masks overlap, the total thickness of Al was 1000 Å (this corresponds to "Position 1" shown in FIG. 19(*a*)). The resultant pattern of the two shadow masks is shown in FIG. 20. The organic layers were then deposited by VTE. The organic stack 2100 for experimental Panel 3 is shown in FIG. 21. As was noted above, the exact details of the organic stack are not important, though the structure is almost identical to that used for exemplary Panels 1(a)-(c) and Panel 2. For Panel 3, the semi-transparent cathode comprised of 180 Å Mg doped with 10% Ag, which was blanket deposited onto the organic layers. FIG. 22 shows a schematic of the top-emission OLED architecture used for Panel 3.

As shown in this example, the embodiment of FIG. 22 comprises: a substrate 2201 (which is shown as being transparent but could also be semi-transparent); a bottom electrode comprising: a blanket layer of transparent conductive material 2222 disposed over the substrate 2201 and adjacent to the substrate 2201, and a patterned layer of reflective conductive material 2221 (e.g. Al) disposed over the blanket transparent conductive layer 2222 and adjacent thereto; an organic emitting layer (EML) 2202 disposed over the patterned reflective conductive layer 2221 and the transparent conductive layer 2222; and a top electrode comprising a blanket layer of transparent conductive material 2211 (which is shown as being transparent but could also be semi-transparent) disposed over the organic layer 2202. As shown, this embodiment may comprise two emissive regions: a first emissive region 2203 corresponding to the portions of the device where the patterned layer of material 2221 is disposed and where light is emitted through the top electrode 2211 of the device, and a second emissive region corresponding to portions of the device where the patterned layer of material 2221 is not disposed (having reflectance R2). However, in the second emissive region, light 2204 is emitted through both the top electrode 2211 of the device, and light 2205 is also emitted through the substrate 2201 and bottom electrode 2222 of the device. The optical properties of the light emitted from each side of the device in the second emissive region may therefore be different based on the properties of the cathode (e.g. conductive layer 2211) in comparison to the anode (e.g. conductive layer 2222) and the substrate (2201).

The exemplary Panel 3 fabricated by the inventors was illuminated at 6.0 V with I=0.091 A. Luminance and CIE 1931 (x, y) coordinates were measured at two different positions, as shown in FIG. 19(*a*). Position 1 corresponds to a region where there is an IZO/Al anode (having reflectance R1), while Position 2 corresponds to a region where there is an IZO anode (having reflectance R2). Measurements were taken at normal incidence (0°) and at 60° at Positions 1 and 2 from both the cathode side and the anode side. The measured data is shown in Table 4 below:

TABLE 4

Luminance and emission color at Positions 1 and 2 on OLED light Panel 3. All measurements were taken at V = 6.0 V.

| Measurement Angle and Electrode Side | Panel 3 Measurement Position 1 R1 Region [IZO/Al] | | Panel 3 Measurement Position 2 R2 Region [IZO] | |
|---|---|---|---|---|
| | Luminance [cd/m$^2$] | CIE 1931 (x, y) | Luminance [cd/m$^2$] | CIE 1931 (x, y) |
| Cathode 0° | 15 | (0.423, 0.321) | 25 | (0.340, 0.401) |
| Cathode 60° | 10 | (0.335, 0.520) | 25 | (0.371, 0.458) |
| Anode 0° | 0 | N/A | 245 | (0.395, 0.413) |
| Anode 60° | 0 | N/A | 220 | (0.399, 0.437) |

At Position 1, the inventors observed a pink emission (labeled as corresponding to emissive region "L1c" 2203) from the cathode side at normal incidence having CIE 1931 (x, y) coordinates of (0.423, 0.321). At 60° from normal incidence, emission color at Position 1 on the cathode side of the exemplary device is quite a saturated green having CIE 1931 (x, y) coordinates of (0.335, 0.520). This large color shift is expected for a strong optical cavity. There is no emission from the anode side at Position 1 because the anode layer 2221 is opaque, and therefore as shown in FIG. 22, the light in this region is mostly reflected and thereby emitted through the cathode 2211.

At Position 2, the inventors observed approximately white emission from the cathode side (labeled as emissive region "L2c" 2204) at normal incidence having CIE 1931 (x, y) coordinates of (0.340, 0.401), with an appreciable color shift to CIE 1931 (x, y) coordinates of (0.371, 0.458) observed at 60° from the surface normal. In contrast, at Position 2, from the anode side the inventors observed white emission (labeled as emissive spectrum "L2a" 2205) at normal incidence having CIE 1931 (x, y) coordinates of (0.395, 0.413) with a small color shift to CIE 1931 (x, y) coordinates of (0.399, 0.437) observed at 60° from the surface normal.

Figure 23:
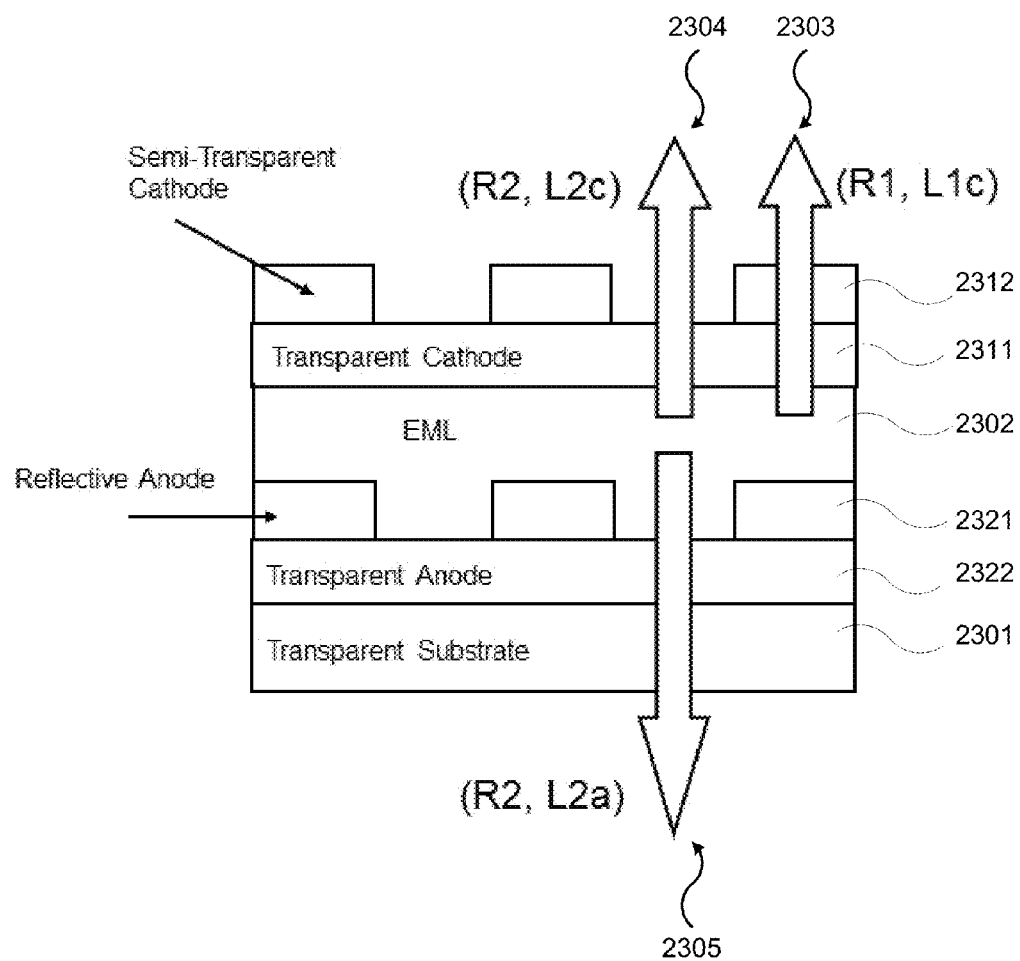
FIG. 23 shows a cross-sectional view of an exemplary transparent OLED architecture in accordance with some embodiments.

In general, any number of patterned layers may be utilized to create variable reflectance/transmittance of one or both electrodes, and thereby provide a device having light emissions that have desired optical properties that may vary across the device. In this regard, FIG. 23 shows such an exemplary embodiment that comprises: a substrate 2301 (which is shown as being transparent but could also be semi-transparent); a bottom electrode comprising: a blanket layer of transparent conductive material 2322 disposed over the substrate 2301 and adjacent to the substrate 2301, and a patterned layer of reflective conductive material 2321 (e.g. Al) disposed over the blanket transparent conductive layer 2322 and adjacent thereto; an organic emitting layer (EML) 2302 disposed over the patterned reflective conductive layer 2321 and the transparent conductive layer 2322; and a top electrode comprising: a blanket layer of transparent conductive material 2311 disposed over the organic layer 2302 and a patterned layer of semi-transparent material 2312 (which may be conductive or non-conductive in some embodiments) disposed over the blanket layer of transparent conductive material 2311. Note that, the patterned layer of semi-transparent material 2312 is aligned with the reflective conductive material 2321, i.e., both 2312 and 2321 are disposed in the same emissive regions. However, in other embodiments, they may be disposed alternatively, such as the example shown in FIG. 24 that will be discussed below. As shown, this embodiment may also comprise two emissive regions: a first emissive region 2303 corresponding to the portions of the device where the patterned layers of material 2321 and 2312 are disposed and where light is emitted through the top electrode 2311 of the device, and a second emissive region corresponding to portions of the device where the patterned layers of material 2321 and 2312 are not disposed. As noted above, in the second emissive region, light 2304 is emitted through the top electrode 2311 of the device, and light 2305 is also emitted through the substrate 2301 and bottom electrode 2322 of the device. The optical properties of the light emitted from each side of the device in the second emissive region may therefore be different based on the properties of the cathode (e.g. conductive layer 2311) in comparison to the anode (e.g. conductive layer 2322) and the substrate (2301).

4. Exemplary Double-Sided Emission Designs

A fourth exemplary embodiment could comprise an OLED light panel with controlled emission from both sides of the panel. While many design features and combinations described above may be applicable to such embodiments, in general, for such OLEDs, regions of both electrodes should be transparent or semi-transparent, although neither side of the device need be entirely transparent or semi-transparent. An exemplary design is shown by example only in FIG. 24.

In this example, the reflectance of the anode varies across the panel, and the reflectance of the cathode varies across the panel. This is controlled in such a way that there is emission from the anode side (corresponding to the emissive region "L2" 2404), where the device comprises a transparent (or semi-transparent) anode (corresponding to a portion of the conductive layer 2422) and a reflective cathode (having reflectance R2 and corresponding to patterned layer 2412), and emission from the cathode side (corresponding to the emissive region "L1" 2403) where the device comprises a transparent (or semi-transparent) cathode (corresponding to a portion of the conductive layer 2411) and a reflective anode (having reflectance R1 and corresponding to the patterned layer of 2421).

Figure 24:
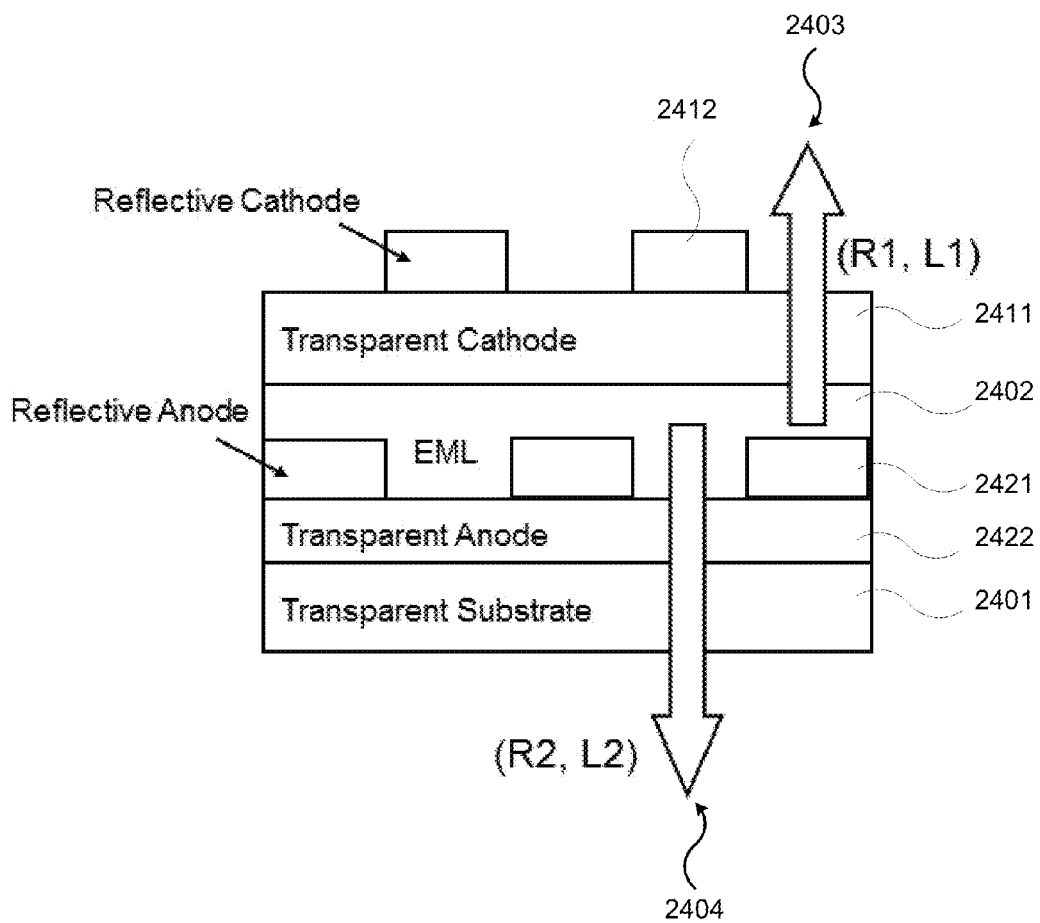
FIG. 24 shows a cross-sectional view of an exemplary double emission OLED architecture in accordance with some embodiments.

The organic stack 2402 in the exemplary device illustrated in FIG. 24 could be common, or it could be different in the different electrode regions. Where the stack is common, a white emissive materials set could be used and the optical cavity could be tuned on either side of the device to determine the emission from either side of the device. For example the light emission corresponding to emissive region L1 (2403) could be blue, while the light emission corresponding to emissive region L2 (2404) could be pink. One advantage that this exemplary architecture could provide over a standard transparent device is that in a standard transparent device (such as the exemplary embodiments shown in FIGS. 22 and 23) both electrodes must be at least semi-transparent. In contrast, the architecture for a double-sided emission device enables one electrode to be reflective in each of the emissive regions. This allows for stronger optical cavities to be formed. This also allows for equivalent emission on both sides of the substrate, which is difficult to achieve in a transparent device because of the different reflectance/transmittance of the electrodes on either side of the panel.

Additional Considerations

The inventors have found that Ag is particularly well-suited to comprise the semi-transparent electrode regions in the exemplary bottom-emission embodiments. This is because Ag can have high conductivity and high transmittance at the same time, and also enable charge injection (e.g. when disposed adjacent to the organic layer). The inventors have also found that Al and Ag are particularly well-suited to provide the reflective electrode regions in the exemplary top-emission embodiments. This is because they can have high reflectance and high conductivity at the same time, and may also enable charge injection. Some exemplary materials that could be used for the transparent anode include ITO and IZO. Some exemplary materials that could be used for the transparent cathode may include Mg doped with Ag (e.g. 10% wt.) or Ca.

In some embodiments, monochrome emitters, such as red, green or blue could be used instead of a WOLED stack. For monochrome emitters, at normal incidence it is expected to have greater intensity and deeper emission color saturation for the stronger microcavity regions compared to the weaker microcavity regions. In contrast, at angles away from normal incidence, it is expected that there is lower intensity for the stronger microcavity regions compared to the weaker microcavity regions.

In the examples shown and described above, the inventors demonstrated only panels with 100% aperture ratio within the outline of the emissive area. In some other exemplary embodiments, emissive regions on a panel could be connected in series or in parallel with small spaces between the emissive regions. The electrode reflectance across the panel could then be varied to control emission color and brightness. For example, on a top-emission foil panel, alternating pixels could be connected in series or in parallel, where an IZO anode is used for one half of the pixels, and an Al anode is used for the remaining half of the pixels. Al has higher reflectance than IZO, so the Al anode pixels would enable strong microcavity emission, while the IZO anode pixels would enable weak microcavity emission. This would lead to controlled color and or brightness variation across the panel. For example, the Al anode pixels could be pink at normal incidence, while the IZO anode pixels could be white at normal incidence (assuming a similar OLED stack to the one shown in FIG. 5).

Exemplary Embodiments

Described below are exemplary embodiments of devices (such as lighting panels) that may comprise an electrode having a patterned layer of material that contributes to controlling the reflectance or transmittance of the electrode(s) (e.g. the cavity effect) of such devices at different positions on the panel. The embodiments described herein are for illustration purposes only and are not thereby intended to be limiting. After reading this disclosure, it may be apparent to a person of ordinary skill in the art that various components and/or features as described below may be combined or omitted in certain embodiments, while still practicing the principles described herein.

A first device may be provided in some embodiments. The first device may comprise a substrate, a first emissive region, and a second emissive region, where the first emissive region and the second emissive region may comprise a contiguous area. The first device may further comprise a first electrode disposed over the substrate that extends across the first and the second emissive regions, and an organic layer disposed over the substrate that extends across the first and second emissive regions, where the organic layer comprises the same emissive material across the first and the second emissive regions. The first device may further include a second electrode disposed over the substrate that extends across the first and second emissive regions, where the second electrode includes a patterned layer of conductive material that is disposed in the first emissive region but that is not disposed in the second emissive region.

As used in this context, the term "contiguous" is used to refer to a device as comprising a single emitting area that is not separated by a non-emitting area. That is, there is no dead space disposed between the first and second emissive regions, such as the space that may separate two different devices disposed on the same substrate. However, this does not necessarily require that the device have a 100% aperture ratio, but merely recites in this embodiment that the first and second emissive regions are not separated by a non-emitting area (e.g. dead space).

As used in this context, the term "extends across" may refer to when a layer is disposed within the region such that it covers the region. For example, a layer that "extends across" a region of a device would be disposed over the entire region. With reference to FIG. 7 as an example, the blanket conductive layer 722 may be considered to extend across the emissive regions 703 and 704. Conversely, the patterned layer of conductive material 721 may be considered to be "disposed in" the emissive region 703 but "is not disposed in" the emissive region 704.

In general, embodiments disclosed herein may provide a device where the second electrode may generally be "different" in the first and second emissive regions. The term "different" may refer to when the second electrode may comprise a different material in the first emissive region than in the second emissive region, a different thickness of materials (e.g. FIG. 13(c)), or may comprise an additional material or materials in the first emissive region that are not included in the second emissive region (e.g. FIGS. 7, 13(a)-(d), 16, 17, 18(a)-(c), and 22-24). For example, the second electrode (which may be an anode or cathode) may comprise a first material (or layer) in both the first emissive region and the second emissive region, and may comprise a second material disposed over (or under) the first material in the first emissive region, but which is not disposed in the second emissive region. In this way, the reflectance and/or transmittance of the second electrode may vary across the device, which may be utilized to vary the optical properties of light emitted in the different emissive regions while also, in some embodiments, improving the conductivity of the electrode without reducing the aperture ratio of the device.

In some embodiments, in the first device as described above, the second electrode may be semi-transparent in the first emissive region, the second electrode may be transparent in the second emissive region, and the first electrode may be opaque or reflective. Examples of such embodiments were described above with reference to the bottom-emission devices in FIGS. 7, 13(a), (b), and (d); and the top-emission devices shown in FIG. 18(a)-(c). That is, rather than adding additional layers of transparent materials to improve device performance without affecting the optical properties of the light emissions, embodiments herein may include semi-transparent components that may affect the optical properties of the device in a particular emissive region in a predetermined or controlled manner. In addition, the semi-transparent material may also have lower sheet resistance than a transparent conductor so as to provide a more uniform panel, while still allowing light to transmit through the material and thus not affect the aperture ratio.

In some embodiments, the substrate may be transparent and the second electrode may be disposed over the substrate, the organic layer may be disposed over the second electrode, and the first electrode may be disposed over the organic layer. An example of such an embodiment is shown in the bottom-emitting device shown in FIG. 7 and described above. In some embodiments, the first electrode may be disposed over the substrate, the organic layer may be disposed over the first electrode, and the second electrode may be disposed over the organic layer. Examples of such embodiments were described above with reference to the top-emitting devices, such as the exemplary embodiments shown in FIGS. 18(a)-18(c).

In some embodiments, in the first device as described above, the second electrode may be semi-transparent or reflective in the first emissive region, the second electrode may be transparent in the second emissive region, and the first electrode may be transparent or semi-transparent. In some embodiments, the second electrode may be disposed over the substrate, the organic layer may be disposed over the second electrode, and the first electrode may be disposed over the organic layer. In some embodiments, the substrate may be transparent. That is, for example, embodiments such as the one described above may correspond to a transparent OLED (TOLED), such as the exemplary embodiment described above with reference to FIG. 22. The first electrode (e.g. electrode 2211) is transparent and the substrate 2201 and at least a portion of the second electrode 2222 are also transparent or semi-transparent. In some embodiments, the substrate may be reflective. For example, the exemplary top-emitting device shown in FIG. 16 includes a substrate 1601 that is reflective, a transparent first electrode 1611, and a second electrode that is reflective in the first emissive region 1603 and transparent in the second emissive region 1604.

In some embodiments, in the first device as described above, where the second electrode is semi-transparent or reflective in the first emissive region, the second electrode is transparent in the second emissive region, and the first electrode is transparent or semi-transparent, the first electrode may be disposed over the substrate, the organic layer may be disposed over the first electrode, and the second electrode may be disposed over the organic layer. In some embodiments, the substrate may be reflective. However, this may not be a preferred embodiment because the transparent electrode may not be as conductive as a reflective electrode and thus will have a higher sheet resistance. In contrast, if the first electrode were to comprise a reflective material, the device could still operate as a top-emitting device, but there would be more freedom to choose the substrate material (because it may not be used for its optical properties given that the first electrode is reflective).

In some embodiments, in the first device as described above, the second electrode may further comprise a blanket layer of conductive material that extends across the first and second emissive regions. As noted above, the active area of a device is disposed between two electrodes, and therefore to maximize the total active area of the device, it may be preferred that the second electrode (that comprises the patterned layer of material) also comprises a blanket layer of conductive material that may extend over the entire device (or extend over the desired active area). In some embodiments, the patterned layer of conductive material of the second electrode may be disposed over the blanket layer of conductive material of the second electrode. In some embodiments, the blanket layer of conductive material of the second electrode may be disposed over the patterned layer of conductive material of the second electrode. In general, for embodiments that include a second electrode that comprises a patterned layer and a blanket conductive layer, the layers may be disposed in any suitable configuration, including in some instances having portions of each layer disposed along side one another (such as in the exemplary embodiments shown in FIGS. 13(*a*), 13(*b*); 18(*b*), and 18(*c*)). In some embodiments, the blanket layer of conductive material and the patterned layer of conductive material of the second electrode may comprise different materials. By utilizing different materials, embodiments may provide for increased cavity effect (particularly associated with the interface between the materials) and may also provide for greater design freedoms and/or greater optical variation across the different emissive regions of the device (e.g. the reflectance or transmittance of the emissive regions may be varied). In some embodiments, the blanket layer of conductive material of the second electrode may comprise a transparent conductive oxide (TCO) and, in some instances, the patterned layer of conductive material may comprise Ag. As noted above, the inventors have found that the use of Ag may be preferred because it may have a high conductivity while remaining relatively transparent. In this regard, it may be preferred in some embodiments that the patterned Ag is thin enough to still remain semi-transparent. In some embodiments, the blanket layer of conductive material and the patterned layer of conductive material of the second electrode may comprise the same material.

In some embodiments, in the first device as described above where the second electrode further comprises a blanket layer of conductive material that extends across the first and second emissive regions, the first electrode may further comprise a blanket layer of conductive material and a patterned layer of conductive material. In some embodiments, the blanket layer of conductive material and the patterned layer of conductive material of the first electrode may comprise different materials. An exemplary device corresponding to such an embodiment is shown in FIG. 23 and described above. In general, the first electrode may comprise any suitable combination of patterned and unpatterned layers, which may be disposed in any suitable configuration (e.g. the patterned layer may be disposed above or below the unpatterned layer). Moreover, the patterned and unpatterned layers of the first electrode may comprise any suitable combination of transparent, semi-transparent, reflective, or opaque depending on the design of the device, the intended application of the device, and any other consideration such as optimum power loss and efficiency of the device. In some embodiments, the blanket layer of conductive material of the first electrode may be transparent or semi-transparent and the patterned layer of conductive material of the first electrode may be reflective. In some embodiments, the second electrode may be reflective in the first emissive region and the second electrode may be transparent or semi-transparent in the second emissive region. In some embodiments, the patterned layer of conductive material of the first electrode may be disposed in the first emissive region and may not be disposed in the second emissive region, as shown in the example device in FIG. 23, and vice versa as shown in FIG. 24. That is, in some embodiments, the patterned layer of conductive material of the first electrode may be disposed in the second emissive region and may not be disposed in the first emissive region. In some embodiments, the substrate may be transparent or semi-transparent, the first electrode may be disposed over the substrate, the organic layer may be disposed over the first electrode, and the second electrode may be disposed over the organic layer.

In some embodiments, in the first device as described above, the organic layer may have the same composition in the first and the second emissive regions. The term "same composition" is used in this context to refer to embodiments where the organic layer may comprise the same sub-layers and other layers (such as HTL or EML) in both emissive regions, and/or the same dopants within each layer, etc. For example, each of the sub-layers of the organic layer may be a blanket layer that extends across the first and second emissive region. This may reduce the fabrication costs of manufacturing the device by reducing the number of processing steps. However, embodiments are not so limited and one or more of the organic layers may be patterned.

In some embodiments, in the first device as described above, the organic layer may have a different composition in the first and the second emissive regions. This may be preferred, in some instances, to tailor the light emissions in the different regions based on the effect of the second electrode (e.g. the sub-layers of the organic layers may be varied in the two emissive regions to account for micro-cavity effects, the desired light emissions (e.g. color, intensity, etc.) from the regions, etc.). In some embodiments, the thickness of the organic layer may be different in the first and the second emissive regions. That is, one or more of the sub-layers (including the EML material) may be varied between the two layers. In some embodiments, the thickness of the organic layer may vary by at least 10% between the first emissive region and the second emissive region. In some embodiments, the thickness of the organic layer may vary by at least 30% between the first emissive region and the second emissive region. In some embodiments, the thickness of the organic layer may vary by at least 50% between the first emissive region and the second emissive region. A person of ordinary skill in the art after reading this disclosure may understand how to vary the thicknesses of the layers to achieve a desired result or effect between the two emissive (or more) emissive regions. It should be noted that although the thickness of the organic layer may differ between the two emissive regions, the organic may include the same emitting material(s) in both regions.

In some embodiments, in the first device as described above where the organic layer may have a different composition in the first and the second emissive regions, the organic layer may comprise a plurality of sub-layers, and the organic layer in the first emissive region may comprise at least one additional sub-layer than the organic layer in the second emissive region. In some embodiments, the organic layer in the second emissive region comprises at least one additional sub-layer than the organic layer in the first emissive region.

In general, the thickness and/or composition of the organic layer (e.g. the sub-layers that comprise the organic layer) may be achieved by any suitable means, including deposition of the layers through one or more shadow masks.

In some embodiments, in the first device as described above, at least a portion of light that is emitted by the organic layer is emitted by the first emissive region and the second emissive region. That is, for example, light may be emitted from both the first and second emissive regions (e.g. the patterned layer of material of the second electrode may be transparent or semitransparent in some embodiments).

In some embodiments, in the first device as described above, the patterned layer of conductive material may have a thickness of less than 1000 Å. In some embodiments, the patterned layer of conductive material may have a thickness of less than 500 Å. In some embodiments, the patterned layer of conductive material may have a thickness of less than 250 Å. In general, any suitable thickness may be used for the patterned layer to achieve a desired or preferred optical property across the device. For example, the thickness may depend on the material of the patterned layer, as well as other considerations such as whether the layer is intended to be transparent, semi-transparent, opaque, or reflective.

In some embodiments, in the first device as described above, the patterned layer of conductive material may have a sheet resistance that is less than 10 ohm/sq. In some embodiments, the patterned layer of conductive material may have a sheet resistance that is less than 1 ohm/sq. As noted above, an advantage that some of the embodiments described herein may provide is to reduce the sheet resistance of the electrode to increase uniformity across the panel, while at the same time not decreasing the aperture ratio of the device. In this regard, in some embodiments, the patterned layer of conductive material may have a transparency of at least 20%. That is, the patterned layer of the second electrode may both conduct current while also having some degree of transparency. In some embodiments, in the first device as described above, the first device may have an aperture ratio of at least 90%. In some embodiments, the first device may have a 100% aperture ratio.

In some embodiments, in the first device as described above, the patterned layer may comprise a plurality of physically segmented portions. In general, as would be understood by one of ordinary skill in the art, reference to "physical separation" or "physical segmentation" of the plurality of portions refers to segments that may not be interconnected (such that there is an area between each component, but that these components may be coupled to the same substrate or other components or layers (such as an organic layer). However, embodiments are not so limited, and the patterned layer may comprise a single contiguous layer across the device (such as the exemplary patterned layers deposited through the masks shown in FIGS. 4 and 20 and described above.

In some embodiments, in the first device as described above, the first device may comprise a total emissive area that is equal to the first emissive region and the second emissive region, where the patterned layer of conductive material may be disposed over at least 10% of the total emissive area of the first device. That is, for example, the inventors have found that depositing the patterned layer (particularly when it comprises a semi-transparent or opaque material) may reduce the sheet resistance of the electrode to provide adequate uniformity across the panel.

In some embodiments, in the first device as described above, the organic layer may emit substantially white light. For example, the organic layer(s) may comprise a red, green, and blue emitter, a blue and a yellow emitter, etc. In addition, the white light may be used in combination with the patterned layer of the second electrode (or multiple patterned layers having different properties may be used) to produce variation across the device for a predetermined and controlled purpose (such as to provide an image or adjust the human effect of area lighting). However, embodiments are not so limited, and the organic layers may comprise any suitable emitter or emitters.

In some embodiments, in the first device as described above, the light that is emitted by the first emissive region at normal incidence may have a first point on the CIE 1976 ($L^*$, $u^*$, $v^*$) color space chromaticity diagram, the light that is emitted by the second emissive region at normal incidence may have a second point on the CIE 1976 ($L^*$, $u^*$, $v^*$) color space chromaticity diagram, and the difference between the first point and the second point may have a duv value that is at least 0.01. In some embodiments, the difference between the first point and the second point may have a duv value that is greater than 0.05. In some embodiments, the difference between the first point and the second point may have a duv value that is greater than 0.10. As noted above, duv is a measure of the general distance in chromaticity between two lighting devices (or emissive regions of a single lighting device). Thus, as noted above, embodiments provided herein may provide for variation of the optical properties of light emitted across the device (and in particular, of the light that is emitted from the first and second emissive regions).

In some embodiments, in the first device as described above, the light that is emitted by the first emissive region may have a first luminance intensity and the light that is emitted by the second emissive region may have a second luminance intensity, where the first luminance intensity may be at least 20% different from the second luminance intensity. Thus, as described above, not only can color or hue vary across the device, but embodiments may also provide for a variation in luminance or brightness as well.

In some embodiments, in the first device as described above, light that is emitted by the first emissive region at normal incidence may have a first point on the CIE 1976 ($L^*$, $u^*$, $v^*$) color space chromaticity diagram and light that is emitted by the first emissive region at a viewing angle of 30° may have a second point on the CIE 1976 ($L^*$, $u^*$, $v^*$) color space chromaticity diagram, where the difference between the first point and the second point may have a duv value that is at least 0.02. In some embodiments, the difference between the first point and the second point may have a duv value that is greater than 0.05. In some embodiments, the difference between the first point and the second point may have a duv value that is greater than 0.10. That is, for example embodiments may provide devices that have regions that exhibit a substantial color shift having an angular dependence. This shift may be dependent on the cavity effect of the region. The exemplary embodiments above would generally be considered to have a strong cavity effect based on the duv value.

In some embodiments, in the first device as described above, light that is emitted by the second emissive region at normal incidence may have a first point on the CIE 1976 (L*, u*, v*) color space chromaticity diagram and light that is emitted by the second emissive region at a viewing angle of 30° may have a second point on the CIE 1976 (L*, u*, v*) color space chromaticity diagram, where the difference between the first point and the second point may have a duv value that is less than 0.05. Such embodiments may be considered to have a weak cavity effect, thereby displaying only a small variance in the color of the light emissions based on the viewing angle.

In some embodiments, in the first device as described above, the first electrode may comprise a blanket layer.

In some embodiments, in the first device as described above, the organic layer may comprise a blanket layer.

In some embodiments, in the first device as described above, the first electrode may comprise a blanket layer, the second electrode may further comprise a blanket layer of conductive material that extends across the first and second emissive regions, and the organic layer may comprise a blanket layer.

In some embodiments, in the first device as described above, the first device may comprise a total emissive area that includes the first emissive region and the second emissive region. In some embodiments, the total emissive area may be greater than 50 cm² and the first device may have luminance uniformity across the second emissive region of at least 50%. In some embodiments, the luminances between the first and second emissive areas are likely to be quite different. However, embodiments may provide that the luminance across the second emissive region may appear relatively uniform, which may result in a consistent color or other optical properties across that region of the device.

In some embodiments, in the first device as described above, the second electrode may further comprise a first conductive layer that extends across the first and second emissive regions and a second conductive layer that extends across the first and second emissive regions. In some embodiments, the patterned layer of the second electrode may be disposed between the first and second conductive layers. Exemplary devices corresponding to such embodiments were described above with reference to FIGS. 3(a), 7, 13(a), 17, and 18(c), for example. In some embodiments, the first and second conductive layers of the second electrode may be transparent. In some embodiments, the first and second conductive layers of the second electrode may comprise a TCO. In some embodiments, the patterned layer of the second electrode may be semi-transparent. In some embodiments, the patterned layer of the second electrode may comprise Ag. In some instances, it may be preferred that the layer of Ag be thin enough to be semi-transparent—e.g. having a thickness that is less than 50 nm.

In some embodiments, in the first device as described above where the second electrode may further comprise a first conductive layer that extends across the first and second emissive regions and a second conductive layer that extends across the first and second emissive regions, where the patterned layer of the second electrode is disposed between the first and second conductive layers, the first conductive layer of the second electrode may be reflective and the second conductive layer of the second electrode may be transparent. As was described above, the first and the second conductive layers may generally be disposed in any suitable configuration (e.g. the first conductive layer may be disposed over the second conductive layer or vice versa). In some embodiments, the patterned layer of the second electrode may be reflective. An example of such an embodiment is shown in FIG. 17 and described in more detail above.

In some embodiments, in the first device as described above, the transmittance of the second electrode in the second emissive region may be at least 10% greater than the transmittance of the second electrode in the first emissive region. In some embodiments, the transmittance of the second electrode in the second emissive region may be at least 20% greater than the transmittance of the second electrode in the first emissive region. In some embodiments, the transmittance of the second electrode in the second emissive region may be at least 50% greater than the transmittance of the second electrode in the first emissive region.

In some embodiments, in the first device as described above, the second electrode may comprise a first conductive layer that has a sheet resistance that may be at least 20% greater than the sheet resistance of the patterned layer of conductive material. In some embodiments, the first conductive layer may have a sheet resistance that may be at least 50% greater than the sheet resistance of the patterned layer of conductive material. In some embodiments, the first conductive layer may have a sheet resistance that may be at least 100% greater than the sheet resistance of the patterned layer of conductive material. As was noted above, embodiments provided herein may be utilized to decrease the sheet resistance of an electrode of a device that may otherwise comprise only a transparent conductive material (which typically has higher sheet resistance values).

In some embodiments, in the first device as described above, the substrate may be flexible. The use of a flexible substrate may have some advantages in certain instances. For example, the shape or positioning of the substrate may be manipulated so as to create optical patterns by varying the viewing angle of different parts of the device in relation to an observer. As noted above, the appearance of light emitted by the device may vary based, at least in part, on the viewing angle and therefore, for example, a substrate that has bends or curves can be used to create a desired optical effect across the panel (such as by creating an image, different color patterns, etc.). A flexible substrate may also be utilized to create a variable image or pattern by changing the physical shape and properties, which may create a dynamic lighting environment in some embodiments.

Figure 13C:
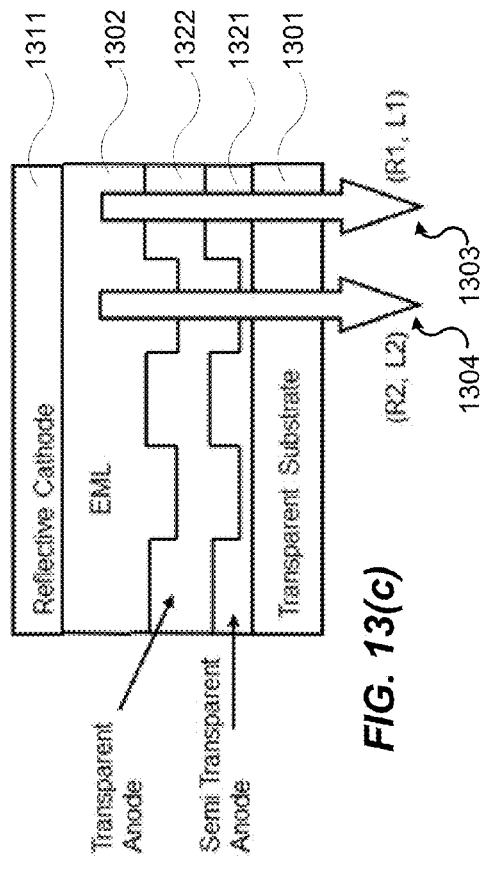
Figure 13D:
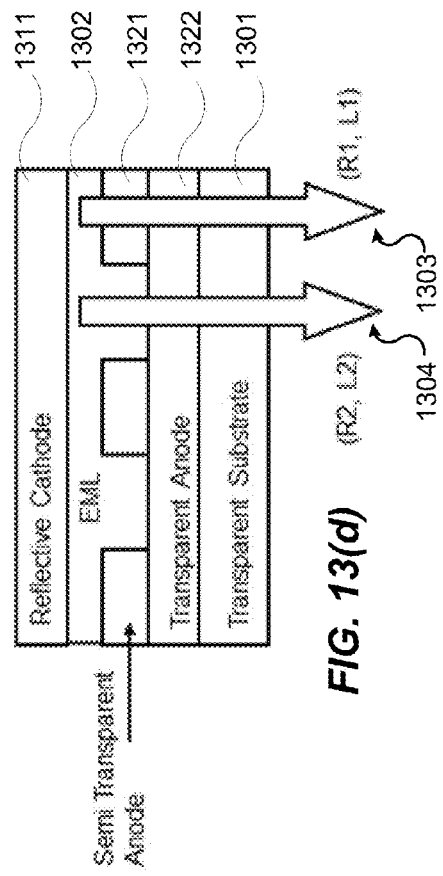

A first device may also be provided in some embodiments that comprises a substrate and a first emissive region and a second emissive region, where the first emissive region and the second emissive region comprise a contiguous area. The first device may further comprise a first electrode that may be disposed over the substrate that extends across the first and the second emissive regions and an organic layer that may be disposed over the substrate that extends across the first and second emissive regions, where the organic layer may comprise the same emissive material across the first and the second emissive regions. The first device may further comprise a second electrode disposed over the substrate that extends across the first and second emissive regions, where the second electrode includes a patterned layer of conductive material having a first thickness disposed in the first emissive region and a second thickness disposed in the second emissive region, where the first and second thicknesses are different. An example of such embodiments is shown in FIG. 13(c) and described above, in which the patterned layer 1321 of the second electrode may be disposed in both the first and second emissive regions, but in different amounts—i.e. having different thicknesses.

In general, embodiments such as those described above and shown in FIG. 13(c) may include devices in which at least a small amount of the patterned layer may be disposed in both emissive regions, but where there may be enough of a difference in the thickness of the patterned layer of conductive material in the two emissive regions such that, for instance, a perceivable difference in the light emitted from the two emissive regions may be obtained. That is, using an electrode(s) having varying thicknesses may create similar device performance in different emissive regions of the device as was described above in embodiments in which the patterned layer may be omitted from the second emissive region. As used in this context, the "thickness" of the patterned layer may refer to the dimension of the patterned conductive layer that is perpendicular to the surface of the substrate over which the electrode is disposed.

In some embodiments, in the first device as described above, the first thickness of the patterned layer may be 75% greater than the second thickness of the patterned layer. This embodiment is generally meant to correspond to a difference in thickness that is greater than the difference that may be associated with manufacturing errors when applying a blanket or uniform layer over a surface. That is, the difference between the thicknesses in the two emissive regions may be substantial enough in some embodiments to achieve a desired variance in optical effect (whether color, tonal variation, uniformity—e.g. compensating for non-uniformity created by the resistance and design of the panel—etc.). In some embodiments, the first thickness of the patterned layer may be 50% greater than the second thickness of the patterned layer. In some embodiments, the first thickness of the patterned layer may be 25% greater than the second thickness of the patterned layer. In some embodiments, the first thickness of the patterned layer may be 10% greater than the second thickness of the patterned layer. It should be understood that the other embodiments and features described above with regard to the materials and configurations of the electrodes (including patterned and blanket layers) and the other components of the device may also apply equally to this exemplary embodiment, except that a portion of the patterned layer may also be disposed in the second emissive region. That is, for example, the first electrode may have any properties (including a blanket and/or conductive layer), and may be disposed over or under the second electrode.

In some embodiments, in the first device as described above, the substrate may be flexible. As noted above, flexible substrates may be utilized, for instance, to create optical patterns by varying the viewing angle of different parts of the device in relation to an observer.

CONCLUSION

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Although many embodiments were described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention.

As noted previously, all measurements, dimensions, and materials provided herein within the specification or within the figures are by way of example only.

A recitation of "a," "an," or "the" is intended to mean "one or more" unless specifically indicated to the contrary. Reference to a "first" component does not necessarily require that a second component be provided. Moreover reference to a "first" or a "second" component does not limit the referenced component to a particular location unless expressly stated.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

What is claimed is:

1. A first device comprising:
   a substrate;
   a first emissive region and a second emissive region, wherein the first emissive region and the second emissive region comprise a contiguous area,
   wherein light that is emitted by the first emissive region at normal incidence has a first point on the CIE 1976 (L*, u*, v*) color space chromaticity diagram;
   wherein light that is emitted by the second emissive region at normal incidence has a second point on the CIE 1976 (L*, u*, v*) color space chromaticity diagram; and
   wherein the difference between the first point and the second point has a duv value that is at least 0.01;
   a first electrode disposed over the substrate that extends across the first and the second emissive regions;
   an organic layer disposed over the substrate that extends across the first and second emissive regions, wherein the organic layer comprises the same emissive material across the first and the second emissive regions; and
   a second electrode disposed over the substrate that extends across the first and second emissive regions, wherein the second electrode includes a patterned layer of conductive material that is disposed in the first emissive region and is not disposed in the second emissive region.

2. The first device of claim 1,
   wherein the second electrode is semi-transparent in the first emissive region;
   wherein the second electrode is transparent in the second emissive region; and
   wherein the first electrode is opaque or reflective.

3. The first device of claim 1, wherein the second electrode further comprises a blanket layer of conductive material that extends across the first and second emissive regions.

4. The first device of claim 1, wherein the first electrode further comprises a blanket layer of conductive material and a patterned layer of conductive material.

5. The first device of claim 1, wherein the organic layer has the same composition in the first and the second emissive regions.

6. The first device of claim 1, wherein the organic layer has a different composition in the first and the second emissive regions.

7. The first device of claim 1, wherein the device has an aperture ratio of at least 90%.

8. The first device of claim 1,
wherein the light that is emitted by the first emissive region has a first luminance intensity,
wherein the light that is emitted by the second emissive region has a second luminance intensity, and
wherein the first luminance intensity is at least 20% different from the second luminance intensity.

9. The first device of claim 1,
wherein light that is emitted by the first emissive region at a viewing angle of 30° has a third point on the CIE 1976 (L*, u*, v*) color space chromaticity diagram; and
wherein the difference between the first point and the third point has a duv value that is at least 0.02.

10. The first device of claim 1,
wherein light that is emitted by the second emissive region at a viewing angle of 30° has a third point on the CIE 1976 (L*, u*, v*) color space chromaticity diagram; and
wherein the difference between the third point and the second point has a duv value that is less than 0.05.

11. The first device of claim 1, wherein the organic layer is a blanket layer.

12. The first device of claim 1,
wherein the first device comprises a total emissive area that includes the first emissive region and the second emissive region;
wherein the total emissive area is greater than 50 $cm^2$; and
wherein the first device has luminance uniformity across the second emissive region of at least 50%.

13. The first device of claim 1,
wherein the second electrode further comprises a first conductive layer that extends across the first and second emissive regions and a second conductive layer that extends across the first and second emissive regions; and
wherein the patterned layer of the second electrode is disposed between the first and second conductive layers.

14. The first device of claim 1, wherein the transmittance of the second electrode in the second emissive region is at least 10% greater than the transmittance of the second electrode in the first emissive region.

15. The first device of claim 1,
wherein the second electrode comprises a first conductive layer; and
wherein the first conductive layer has a sheet resistance that is at least 20% greater than the sheet resistance of the patterned layer of conductive material.

16. The first device of claim 1, wherein the substrate is flexible.

17. The first device of claim 1,
the conductive material having a first thickness disposed in the first emissive region and a second thickness disposed in the second region, wherein the first and second thicknesses are different.

18. The first device of claim 17, wherein the substrate is flexible.

19. The first device of claim 1, wherein the substrate is reflective.

20. The first device of claim 1, wherein the second electrode is semi-transparent in the first emissive region.

21. The first device of claim 1, wherein the second electrode is transparent in the second emissive region.

22. The first device of claim 1, wherein the first electrode is opaque or reflective.

* * * * *